(12) United States Patent
Liao

(10) Patent No.: US 8,278,157 B2
(45) Date of Patent: Oct. 2, 2012

(54) METHODS FOR FABRICATING ARRAY SUBSTRATES

(75) Inventor: Ta-Wen Liao, Miaoli County (TW)

(73) Assignee: AU Optronics Corp., Hsinchu (TW)

( * ) Notice: Subject to any disclaimer, the term of this patent is extended or adjusted under 35 U.S.C. 154(b) by 951 days.

(21) Appl. No.: 12/190,688

(22) Filed: Aug. 13, 2008

(65) Prior Publication Data

US 2009/0017612 A1    Jan. 15, 2009

Related U.S. Application Data

(62) Division of application No. 11/257,455, filed on Oct. 24, 2005, now Pat. No. 7,427,540.

(30) Foreign Application Priority Data

Apr. 8, 2005  (TW) ................ 94111136 A

(51) Int. Cl.
*H01L 21/84*  (2006.01)
(52) U.S. Cl. .. 438/149; 438/151; 438/158; 257/E21.585
(58) Field of Classification Search .............. 438/149, 438/151, 158; 257/E21.585
See application file for complete search history.

(56) References Cited

U.S. PATENT DOCUMENTS

| | | | |
|---|---|---|---|
| 6,531,392 B2 | 3/2003 | Song et al. | |
| 6,649,934 B2 | 11/2003 | Song et al. | |
| 7,223,621 B2 | 5/2007 | Kim | |
| 7,314,783 B2 | 1/2008 | Lee et al. | |
| 7,427,540 B2 * | 9/2008 | Liao | 438/151 |
| 2002/0130324 A1 | 9/2002 | Song et al. | |
| 2005/0078233 A1 * | 4/2005 | Lim et al. | 349/43 |
| 2009/0017612 A1 * | 1/2009 | Liao | 438/637 |

* cited by examiner

*Primary Examiner* — Jack Chen
(74) *Attorney, Agent, or Firm* — Thomas|Kayden

(57) ABSTRACT

Methods for fabricating array substrates are provided. A method for fabricating an array substrate includes forming a first metal layer over a substrate and then patterned by a first photolithography to forming a gate line, a gate electrode connecting the gate line, and a pad over the substrate. An insulating layer, a semiconductor layer, and an ohmic contact layer are formed over the substrate to cover the gate line, the gate electrode and the pad. The ohmic contact layer, the semiconductor layer, and portions of the insulating layer are patterned by a second photolithography to forming a semiconductor structure over the substrate and a via hole in the insulating layer over the pad to exposing a part of the pad.

11 Claims, 25 Drawing Sheets

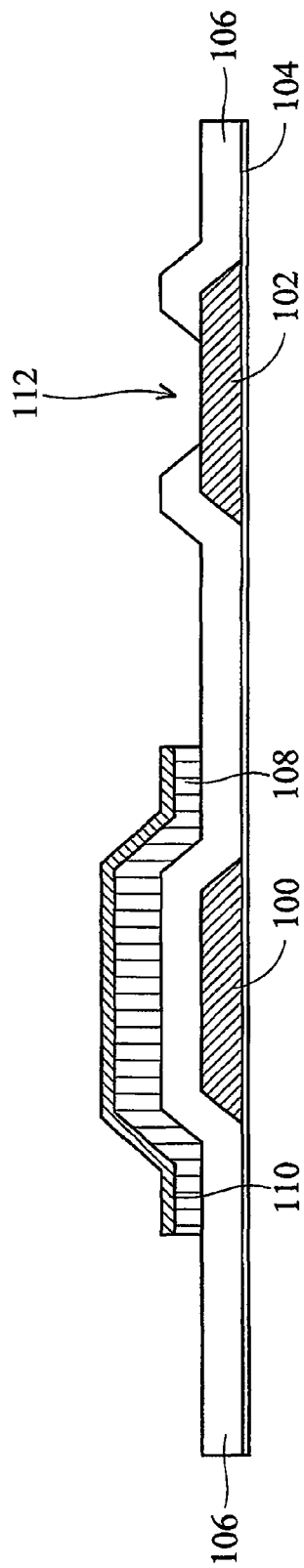
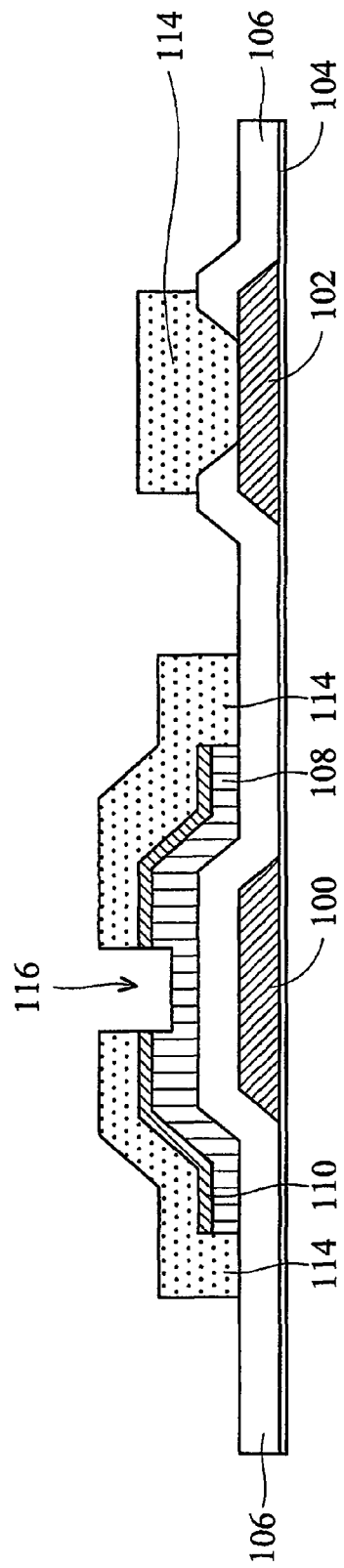
FIG. 1C
FIG. 1D

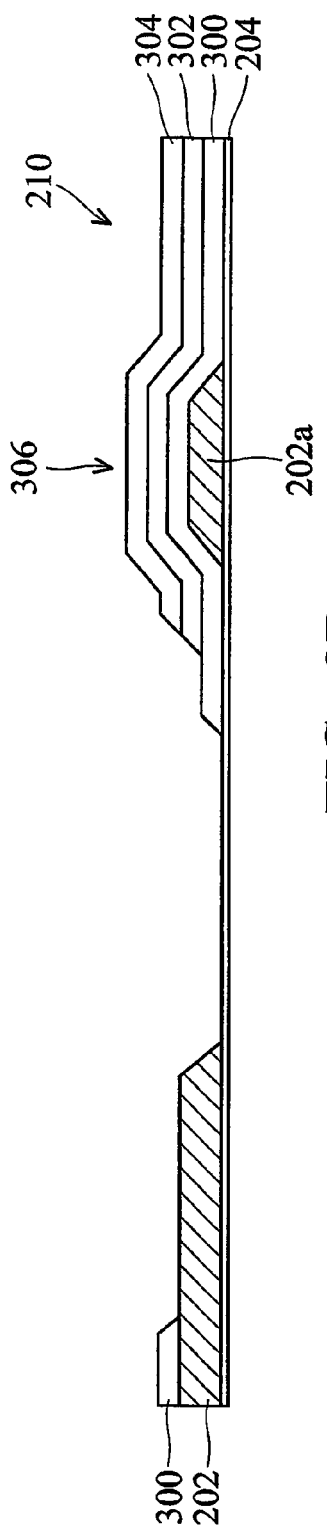
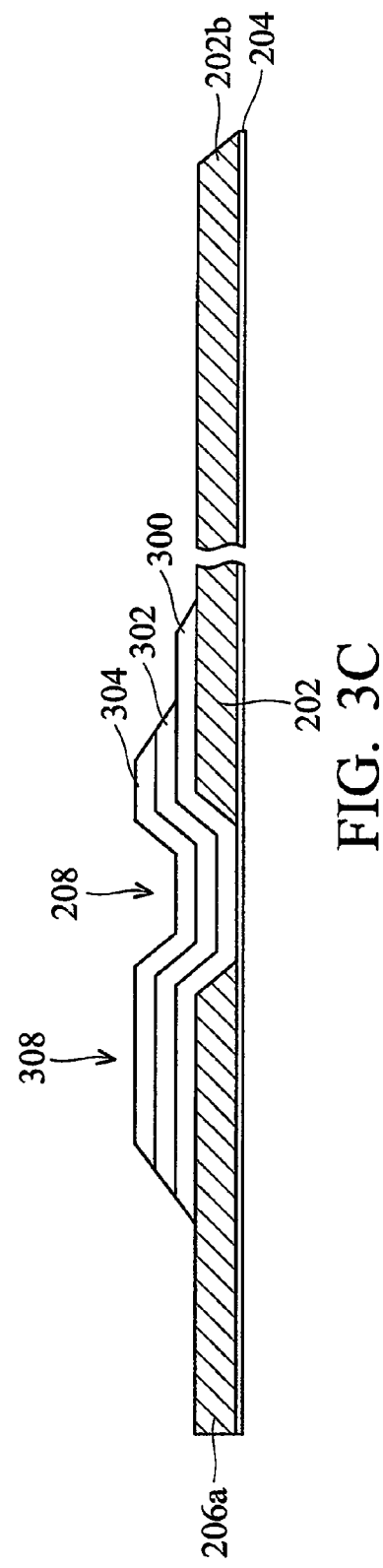

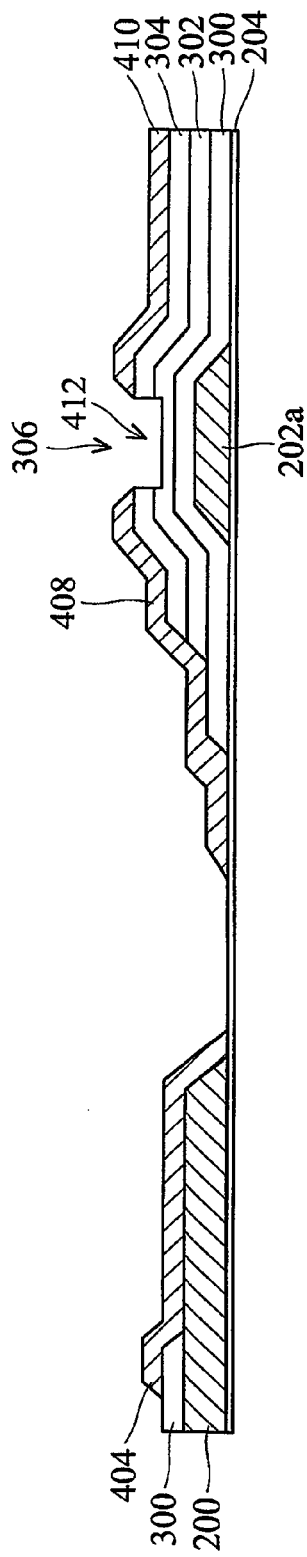
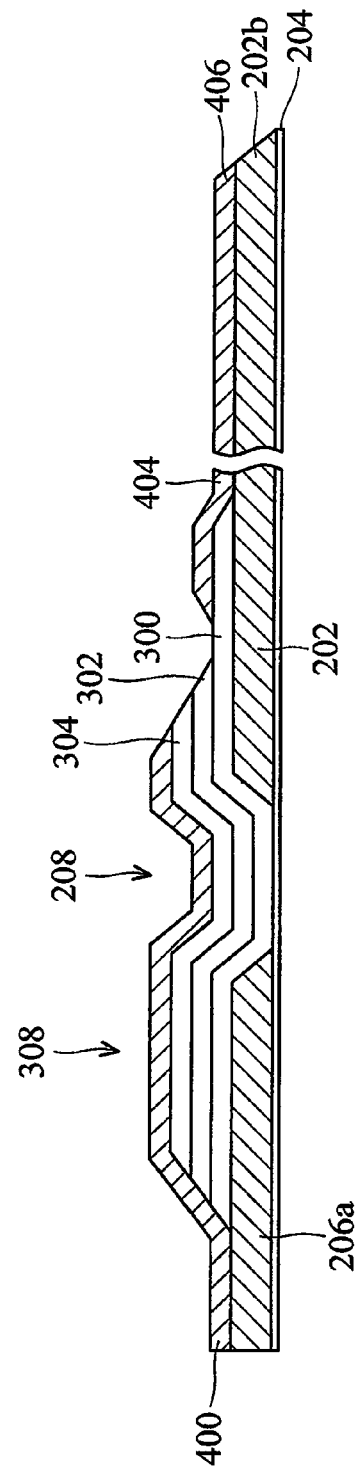
FIG. 4B
FIG. 4C

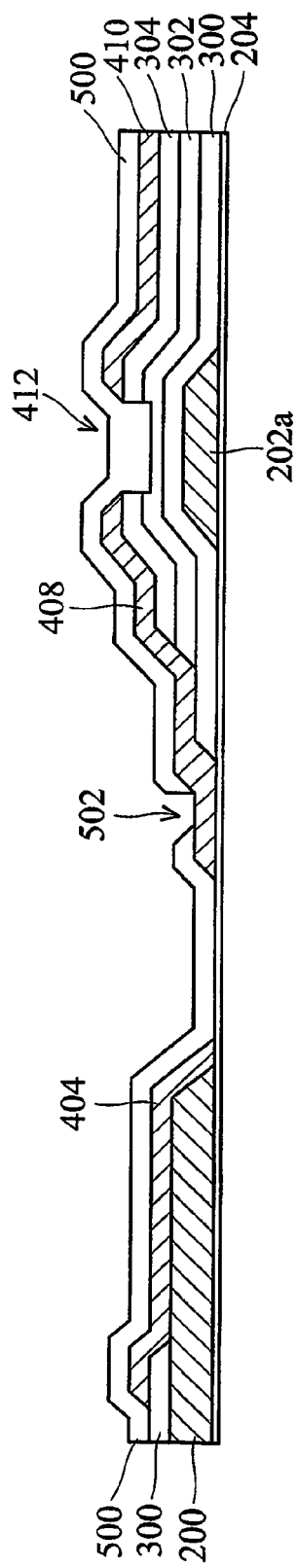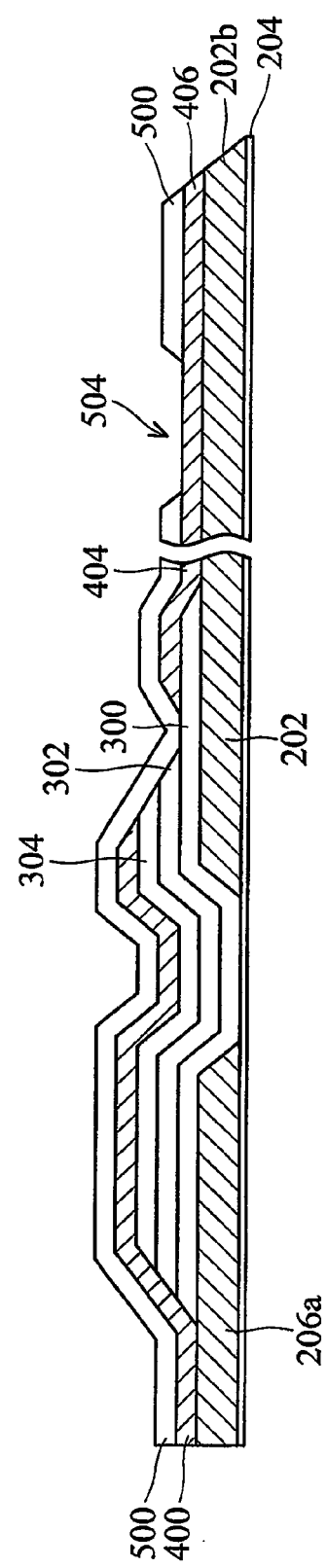
FIG. 5B
FIG. 5C

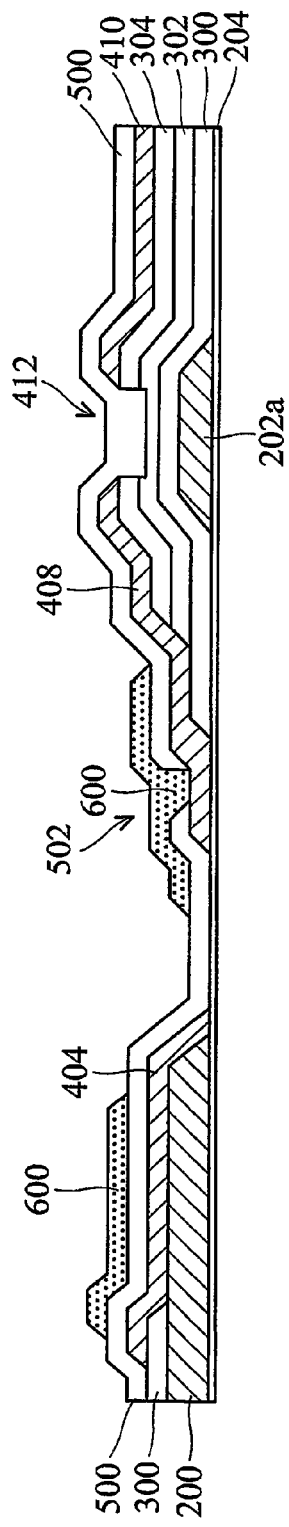
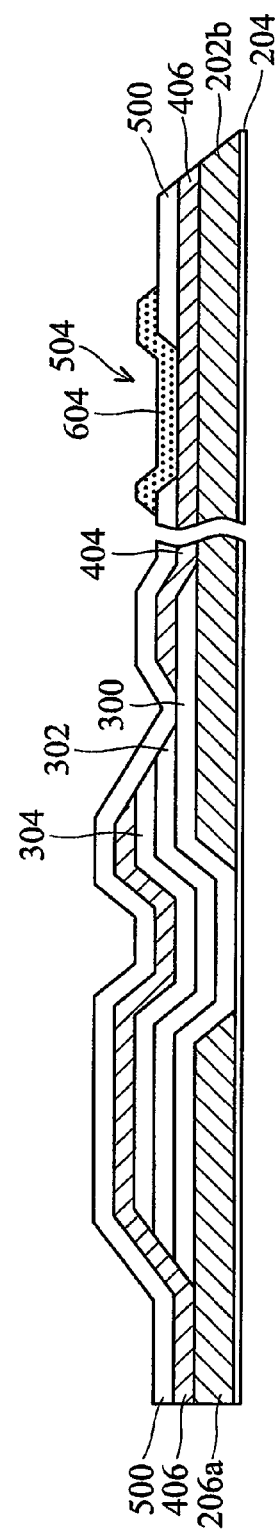
FIG. 6B
FIG. 6C

METHODS FOR FABRICATING ARRAY SUBSTRATES

CROSS REFERENCE TO RELATED APPLICATIONS

This application is a divisional application of pending U.S. patent application Ser. No. 11/257,455, filed on Oct. 24, 2005 and entitled "METHODS FOR FABRICATING ARRAY SUBSTRATES," now issued as U.S. Pat. No. 7,427,540.

BACKGROUND

The present invention relates to display device fabrication, and in particular a method for fabricating an array substrate.

Recently, in order to fulfill the requirements of high-speed image processing and high quality image displays, flat panel displays, such as color liquid crystal displays (LCDs) have become popular. LCDs have an upper and a lower substrate with electrodes thereon. These substrates are sealed with adhesive materials, and a liquid crystal material is sealed between these two substrates. Prior to liquid crystal injection spacers are sprayed between the substrates in order to maintain a constant distance there between. TFTs are typically formed above the lower substrate as switching devices. Each TFT has a gate electrode connected to a scanning line, a drain electrode connected with a signal line, and a source electrode connected to a pixel electrode. The lower substrate is also called an active matrix substrate. The upper substrate includes a color filter and a common electrode. Elements formed over these substrates are typically defined by performing several photolithography steps. Thus, the cost and time required for array substrate fabrication is related to the number of photolithography steps.

FIGS. 1A-1F are schematic diagrams showing a conventional method for fabricating an array substrate using six photolithography steps. In this specification, the term "photolithography" is defined to include the fabrication steps of resist coating, exposure with a patterned mask, resist development, resist etching, and remaining resist removal all of which are well known in the art and are collectively referred to as photolithography hereafter.

In FIG. 1A, a metal layer formed on a substrate 104 is first patterned by a first photolithography step to form a patterned gate 100 for a thin film transistor and a conductive line 102. The conductive line 102 can function as a gate line (i.e. scan line) or data line (i.e. signal line) and is formed over the substrate 104 in continuous manner.

In FIG. 1B, an insulating layer 106, semiconductor layer 108, and ohmic contact layer 110 are then blanketly formed over the substrate 104 in sequence and are then patterned by a second photolithography step to define a patterned semiconductor layer 108 and ohmic contact layer 110 over the portion of the insulating layer 106 over the gate 100.

In FIG. 1C, a via hole 112 is then formed passing through the insulating layer 106 at a place relative to the conductive line 102 by a third photolithography step.

In FIG. 1D, another metal layer is blanketly formed over the substrate 104 and then patterned by a fourth photolithography step to form a conductive layer 114 overlying the conductive layer 102 and the patterned ohmic contact layer 110 and semiconductor layer 108 adjacent to the gate 100. In the fourth photolithography step, the metal layer 114, ohmic contact layer 110, and portions of the semiconductor layer 108 adjacent to the gate 110 are simultaneously etched away to thereby form a recess 116. A thin film transistor is thus fabricated over the substrate.

In FIG. 1E, a passivation layer 118 is then blanketly formed over the structure illustrated in FIG. 1D and then patterned by a fifth photolithography step to form a patterned passivation layer 118 with a via hole 120 which exposes a portion of the metal layer 114 at suitable position, as a contact area.

In FIG. 1F, a transparent conductive layer 122 is then formed in the via hole 120 and over the passivation layer 118 and then patterned by a sixth photolithography step to form patterned transparent conductive layer 122 over the passivation layer 118 to function as a pixel electrode. Thus, fabrication of an array substrate is complete.

Generally, the conductive line for functioning as a scan or signal line is formed of a continuous conductive layer. With LCD panel size increasing, scan and signal lines of such structure formed with a greater length thus increase a resistance thereof and are not suitable for fabricating LCDs display of larger size. Moreover, as the fabrication steps illustrat in FIGS. 1A-1F, an additional conductive layer 114 is thus formed over the conductive line 102 increasing a thickness thereof to thereby reduce overall resistance and signal loss thereof. The above process takes six photolithography steps, however, and makes the process more time consuming. Thus, a simplified array substrate process with less photolithography steps is desirable for display device fabrication.

SUMMARY

Methods for fabricating array substrates are provided. In an exemplary embodiment, a method for fabricating an array substrate comprises forming a first metal layer over a substrate. The first metal layer is patterned by a first photolithography to forming a gate line, a gate electrode connecting the gate line, and a pad over the substrate. An insulating layer, a semiconductor layer, and an ohmic contact layer are formed over the substrate to cover the gate line, the gate electrode and the pad. The ohmic contact layer, the semiconductor layer, and portions of the insulating layer are then patterned by a second photolithography to form a semiconductor structure over the substrate and a via hole in the insulating layer over the pad to expose a part of the pad, wherein the semiconductor structure comprises a patterned insulating layer substantially covering the gate electrode, a patterned semiconductor layer and a patterned ohmic contact layer.

In another exemplary embodiment of the invention, a method for fabricating a thin film transistor array substrate includes forming a first metal layer over a substrate. The first metal layer is patterned by a first photolithography to form a gate line continuously extending along a first direction and a plurality of data line sections extending along a second direction, wherein the first direction is different form the second direction and the data line sections are separated from the gate line at an intersection. An insulating layer, a semiconductor layer and an ohmic contact layer are formed over the substrate and then patterned by a second photolithography to form a plurality of semiconductor structures and a plurality of stacked structures crossing over the gate line and the data line sections at intersections thereof. A second metal layer is formed over the substrate and then patterned by a third photolithography to form a plurality of source/drain electrodes over the semiconductor structures and a plurality of continuous data lines extending over the stacked structures to electrically connect the data line sections. A passiviation layer is formed over the substrate and patterned by a fourth photolithography to form a plurality of via holes, exposing a plurality of pads for the data and gate lines and for the source/drain electrodes. A transparent conductive layer is formed over the substrate to fill the via holes and patterned by a fifth photolitography to form a plurality of pixel electrodes and storage capacitors, wherein the storage capacitors partially overlap the gate lines.

A detailed description is given in the following embodiments with reference to the accompanying drawings.

BRIEF DESCRIPTION OF THE DRAWINGS

The invention can be more fully understood by reading the subsequent detailed description and examples with reference made to the accompanying drawings, wherein:

FIGS. 1A-1F are schematic diagrams showing an array substrate process using six steps of photolithography as referenced in the Related Art;

FIGS. 2B, 3B, 4B, 5B and 6B are schematic cross sections showing various fabrication steps of an array substrate according to an embodiment of the invention;

FIGS. 2C, 3C, 4C, 5C and 6C are schematic cross sections showing various fabrication steps of an array substrate according to an embodiment of the invention;

DESCRIPTION

FIGS. 2-6 are schematic diagrams showing fabrication of an array substrate according to an exemplary embodiment, wherein FIGS. 2A, 3A, 4A, 5A, and 6A are top views, and FIGS. 2B-2C, 3B-3C, 4B-4C, 5B-5C, and 6B-6C are cross sections taken along lines B-B and C-C from each top view. In this specification, the term "photolithography" includes fabricating steps of resist coating, exposure with a patterned mask, exposed resist development, resist etching, and remained resist removal all of which are that well known in the art and are collectively referred to as photolithography hereafter for short.

Figure 1A:
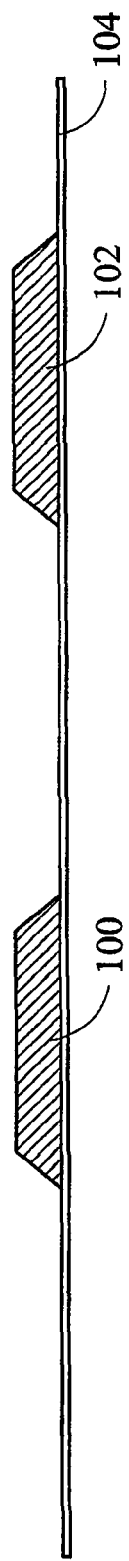
Figure 1B:
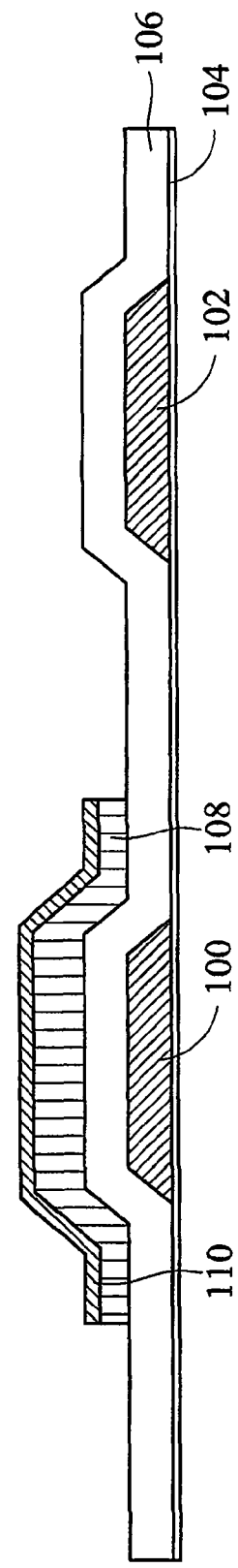
Figure 1E:
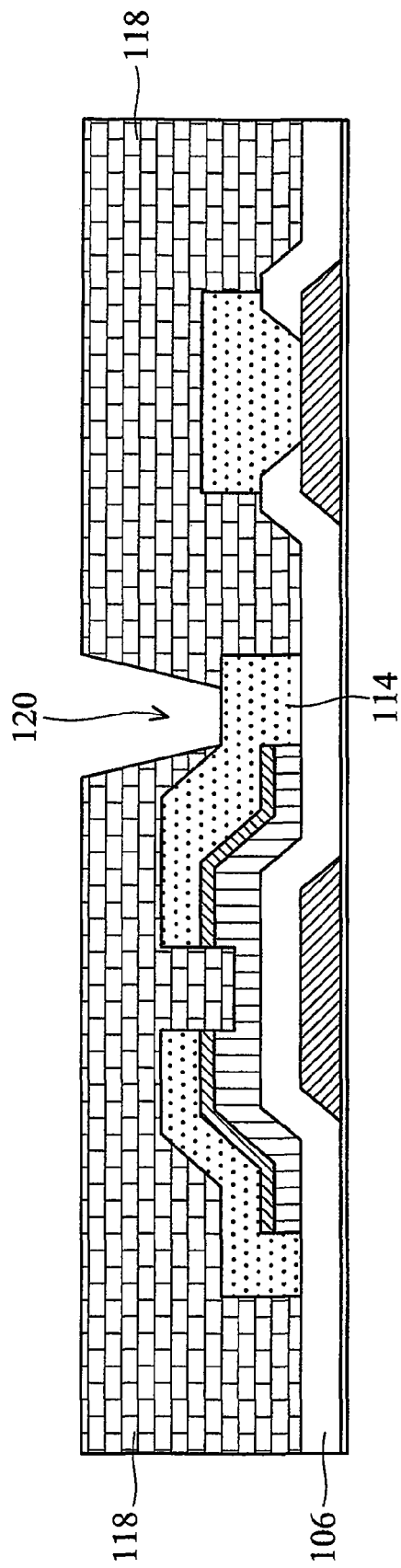
Figure 1F:
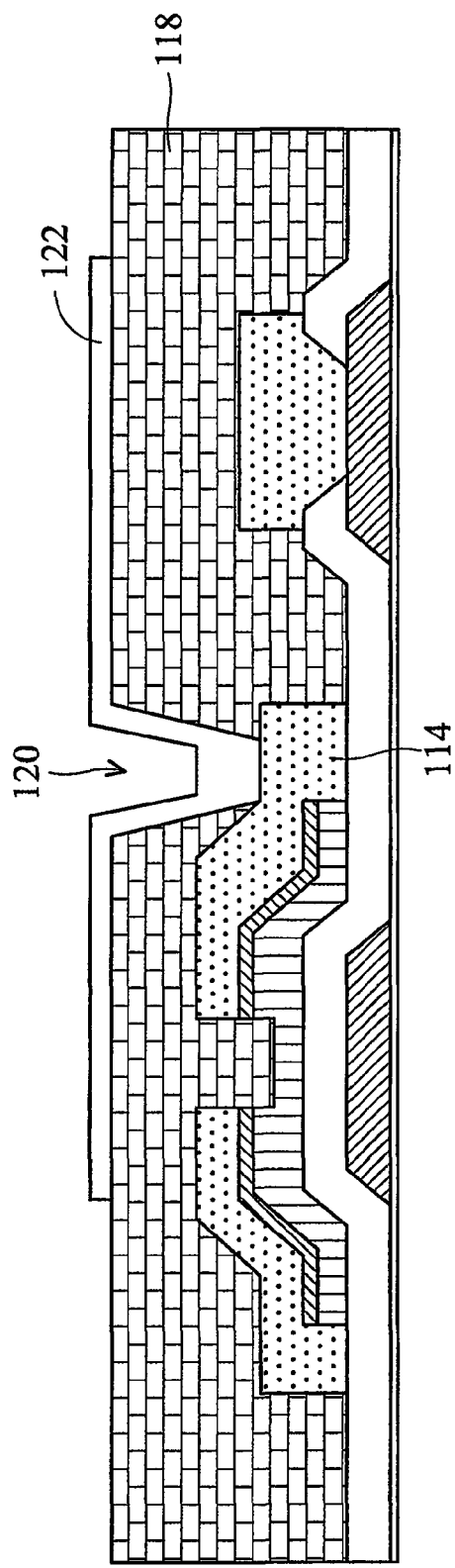
Figure 2A:
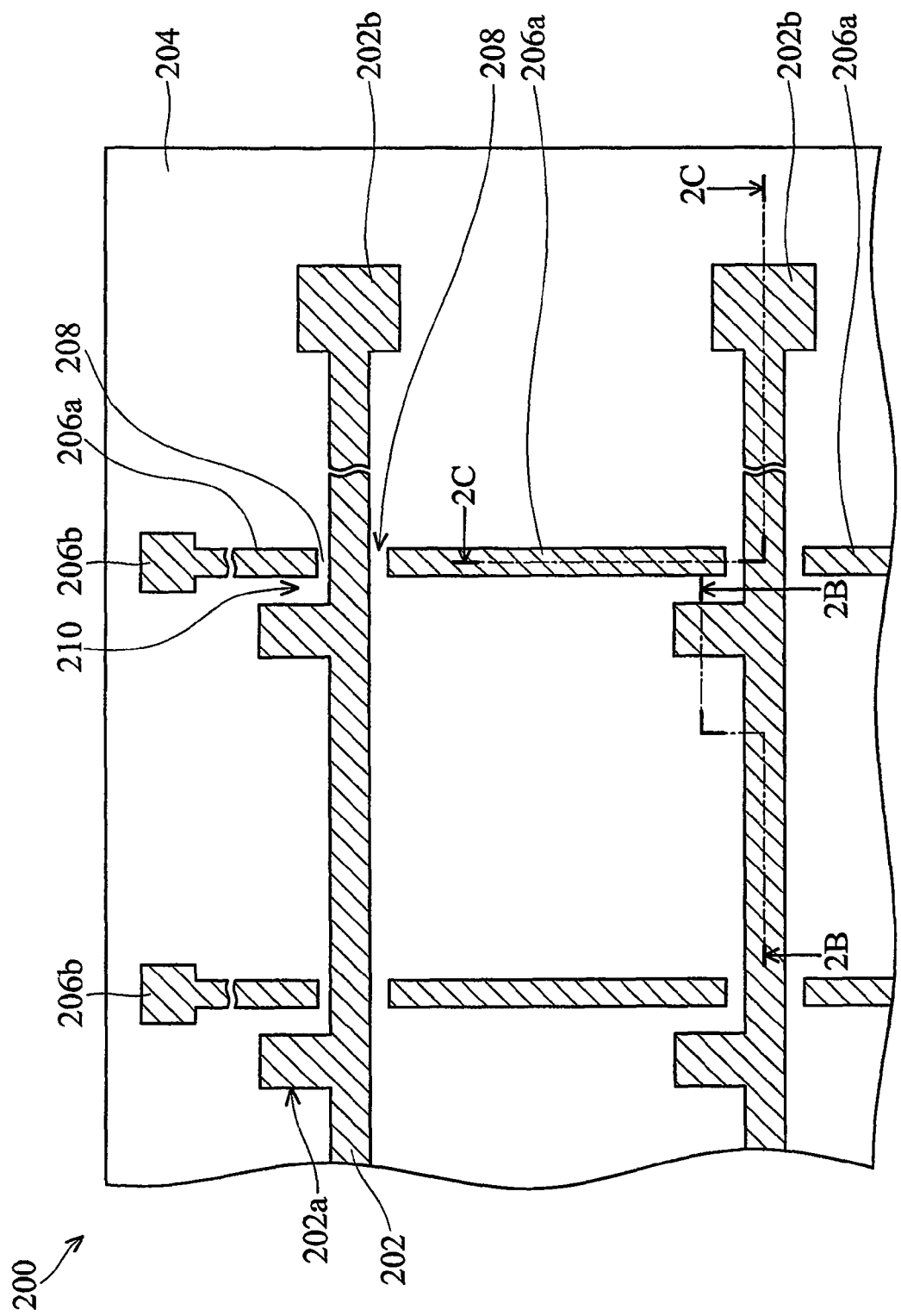
FIGS. 2A, 3A, 4A, 5A and 6A are schematic top views showing various fabrication steps of an array substrate according to an embodiment of the invention.

In FIG. 2A, a top view showing a portion of an array substrate 200 such as a thin film transistor (TFT) array substrate is illustrated. The array substrate 200 includes a substrate 204 with a plurality of conductive lines formed thereon, such as the gate lines 202. In addition, a plurality of conductive segments is also formed on the array substrate 200, such as the data conductive segments 206a. The gate lines 202 and the data conductive segments 206a may comprise metal or other conductive materials and are arranged in rows or columns as illustrated in FIG. 2A, but is not limited thereto and can be formed in other arrangements. Herein, patterns of the gate lines 202 and the data conductive segments 206a are defined by a first photolithography.

In the above first photolithography, a metal layer is formed on the substrate 204 and then patterned to simultaneously form the gate lines 202 and the date conductive segments 206a in a row direction. In addition, pads 202b connected to gate lines 202 with a large area and pads 206b connected to data conductive segments 206a are also formed by the above first photolithography.

As shown in FIG. 2A, a first recess 208 is formed at a crossing of the conductive segments 206a and the gate lines 202 to thereby separate adjacent data conductive segments 206a and gate lines 202. In addition, a second recess 210 is also formed by the above first photolithography to thereby separate adjacent gate line 202a and data conductive segment 206a.

Figure 2B:
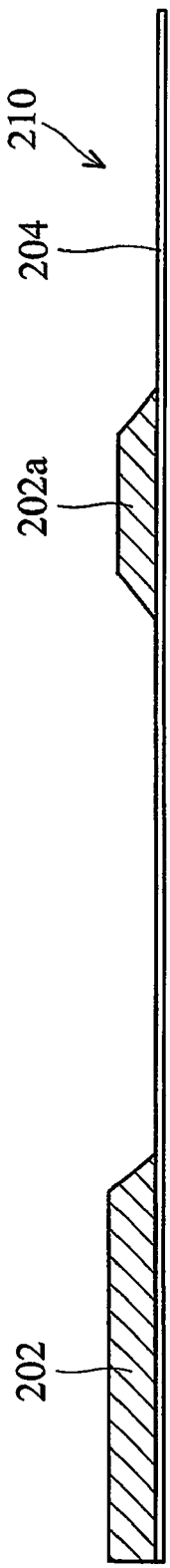
Figure 2C:
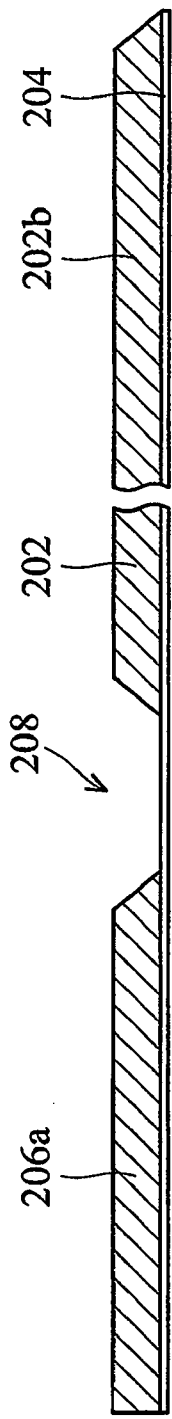

FIG. 2B illustrates a cross sectional view along line 2B-2B of FIG. 2A, showing the gate line 202, the gate electrode 202a for a thin film transistor (TFT) and the second recess 210 adjacent to a data conductive segment (not shown). The gate line 202 and the data conductive segments 202a are formed with a thickness of about 1500-5000 Å and materials thereof can be metals such as Al, Mo, Cr, or Al alloy, or composite alloys such as Mo/AlNd or AlNd/Mo, Mo/Al, Ti/AlNd or AlNd/Ti, Ti/Al or Ti/Al/Ti, Cr/Al, Cr/AlNd or AlNd/Cr, or other metals. FIG. 2C illustrates a cross section along line 2C-2C in FIG. 2A, wherein a substrate 204 with a data conductive segment 206a and a gate line 202 which separated by a first recess 208 and a pad 202b connected to a gate line 202 formed thereon is shown. The gate line 202 and the data conductive segment 202a are formed with a thickness of about 1500-5000 Å and materials thereof can be metal such as Al, Mo, Cr, or Al alloy, or composite alloys such as Mo/AlNd or AlNd/Mo, Mo/Al, Ti/AlNd or AlNd/Ti, Ti/Al or Ti/Al/Ti, Cr/Al, Cr/AlNd or AlNd/Cr, or other metals.

Figure 3A:
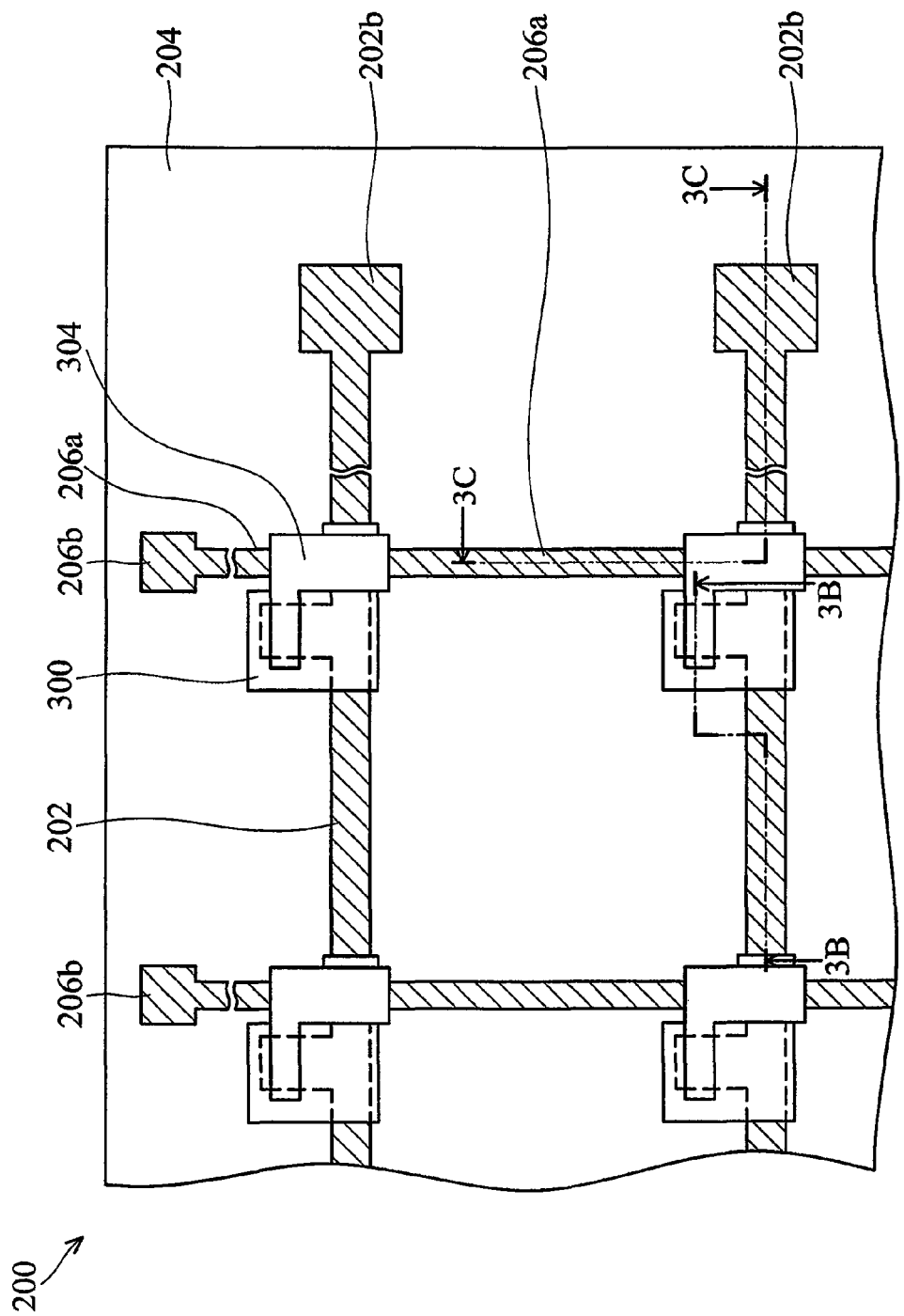

Next, FIG. 3A illustrates a top view of the substrate 200 with a patterned insulating layer 300, semiconductor layer 302 and ohmic contact layer 304 formed thereon by a second photolithography, wherein the patterned insulating layer 300 is formed over the gate electrode 202a and portions of the gate line 202, the data conductive segment 206a and the substrate 204 adjacent to thereof and fills the first recess 208 (see FIG. 3B) and in the second recess 210 (see FIG. 3C) formed between the above components. Herein, the patterned ohmic contact layer 304 is illustrated in a reverse L shaped layer in which substantially covers the semiconductor layer 302 and therefore the semiconductor layer 302 cannot be shown in FIG. 3A.

FIGS. 3B and 3C are schematic diagrams respectively showing a cross section taken along lines 3B-3B and 3C-3C in FIG. 3A, wherein materials for forming the patterned insulating layer 300, semiconductor layer 302 and ohmic contact layer 304 are first blanketly formed and stacked over the substrate 204 in sequence and then patterned by a second photolithography, using a mask having a plurality of areas of various transmittances, thereby forming a resist layer of different thicknesses over the ohmic contact layer 304. During the second photolithography, three sequential etching steps are performed to thereby form stacked structures 306 and 308 respectively over the gate electrode 202a and the first recess 208 and adjacent substrate thereof. The above patterned insulating layer 300, semiconductor layer 302 and ohmic layer 304 are formed of, for example, silicon nitride or silicon oxynitride, α-Si:H and N⁺α-Si:H, at thicknesses of 2000-5000 Å, 1000-3000 Å, and 100-1000 Å, respectively.

In the above second photolithography, the insulating layer 300 and the semiconductor layer 302 of the stacked structures 306 and 308 respectively formed at positions relative to the first recess 208 and second recess 210 over the substrate 204 function as a dielectric barrier and prevent adjacent gate line 202 and data conductive segments 206 and/or adjacent data conductive segments 206a and gate lines 202 from electrically shorts. FIG. 3B illustrates a cross section of the second recess 210 filled by the stacked structure 306 composed of the patterned insulating layer 300, semiconductor layer 302 and ohmic contact layer 302, and FIG. 3C illustrates a cross section of the first recess 208 filled by the stacked structure 308 composed of the patterned insulating layer 300, semiconductor layer 302 and ohmic contact layer 304.

Figure 3D:
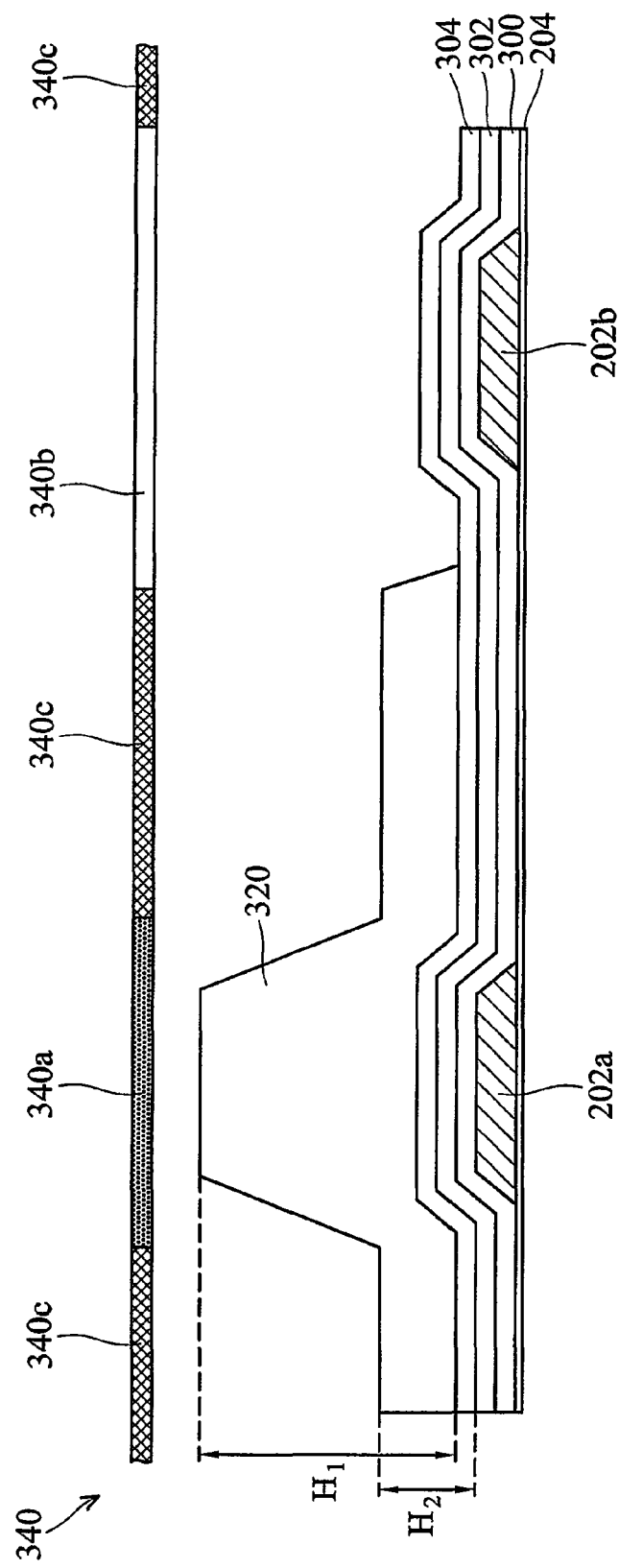
FIGS. 3D-3G are schematic diagrams showing fabricating steps in the second photolithography for the fabrication step illustrated in FIGS. 3A-3C.

Herein, the above second photolithography is further illustrated by the following FIGS. 3D-3G, showing fabrication in an area adjacent to the gate electrode 202a and the pad 202b is illustrated as an example. Fabrication in other areas is not shown here but can be understood and modified by those skilled in the art within the field of the invention. Referring to FIG. 3D, a substrate 204 formed with a gate electrode 202a and a pad 202b thereon is first provided. Next, an insulating layer 300, semiconductor layer 302, and ohmic contact layer 304 are then sequentially formed over the substrate 204 to cover the gate electrode 202a and the pad 202b thereon. Next, a resist layer 320 is coated onto the substrate 204 and exposed during the second photolithography by a conventional photolithography apparatus using a mask 340 illustrated in FIG. 3D. Herein, the mask 340 includes an opaque area 340a, a transparent area 340b, and a plurality of partially light-transmittive areas 340c, wherein the opaque area 340a has a transmittance of about 0% and substantially locates at a position relative to the gate electrode 202a, the transparent area 340b has a transmittance of about 100% and locates at a position relative to the pad 202b, and the partially light-transmittive areas 340c has a transmittance of about 20-80% and locates substantially over other areas. During the second photolithography, a single exposure is performed and a structure is formed after a resist development, as shown in FIG. 3D. The resist layer 320 is patterned and leaves areas of various thicknesses over the areas relative to the gate electrode 202a and the adjacent ohmic contact layer 204 thereof. Due to different transmittance within various areas of the mask 340, the resist layer 320 relative to the transparent area 340b is fully exposed and removed by the resist development. The resist layer 320 relative to the opaque area 340a is not exposed and the partially light-transmittive areas 340c are partially exposed to thereby remain the patterned resist layer 320 with different thicknesses after the resist development. The patterned resist layer 320 relative to the opaque area 340a is formed at a thickness $H_1$ of about 15000-30000 Å and the resist layer relative to the partially light-transmittive area 340c is formed at a thickness $H_2$ of about 3000-20000 Å.

Figure 3E:
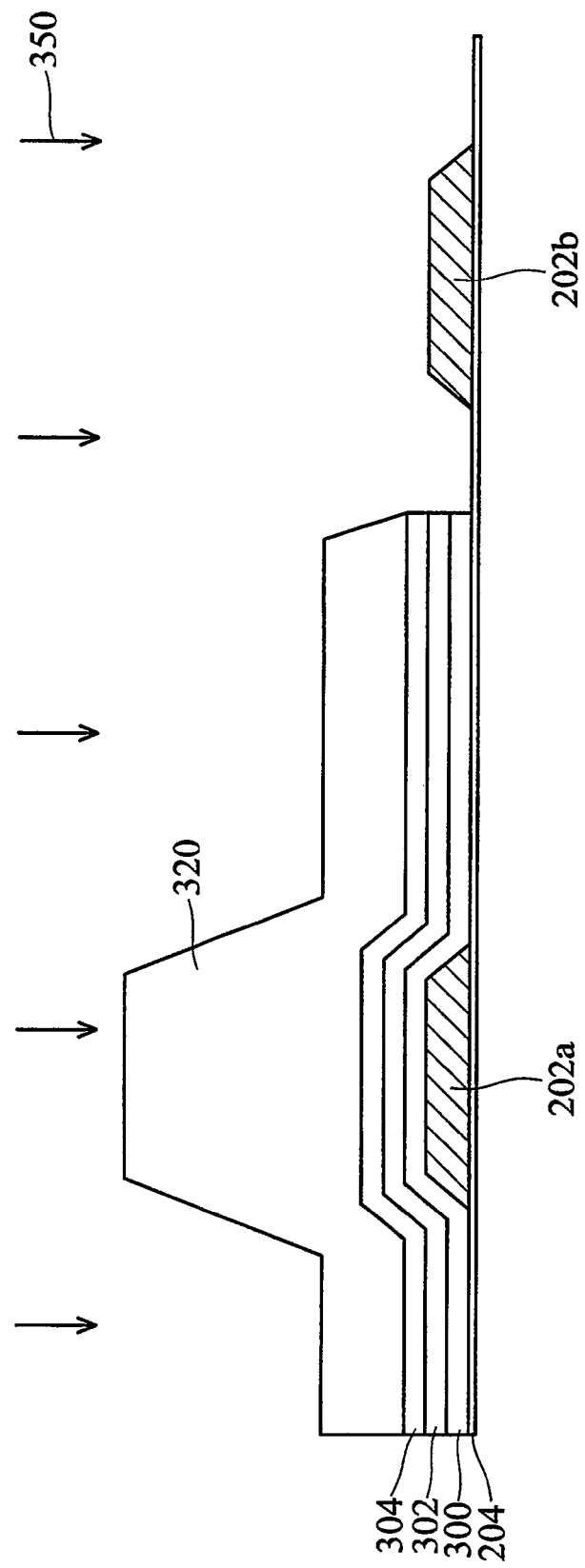

In FIG. 3E, etching process 350 is then performed to remove the ohmic contact layer 304, the semiconductor layer 302, and the insulating layer 300 exposed by the patterned resist layer 320, using etching gas such as $SF_6$, $CF_4$, or other suitable gases, using the patterned resist layer 302 as an etching mask, and stops on the substrate 204 and the pad 202b.

Figure 3F:
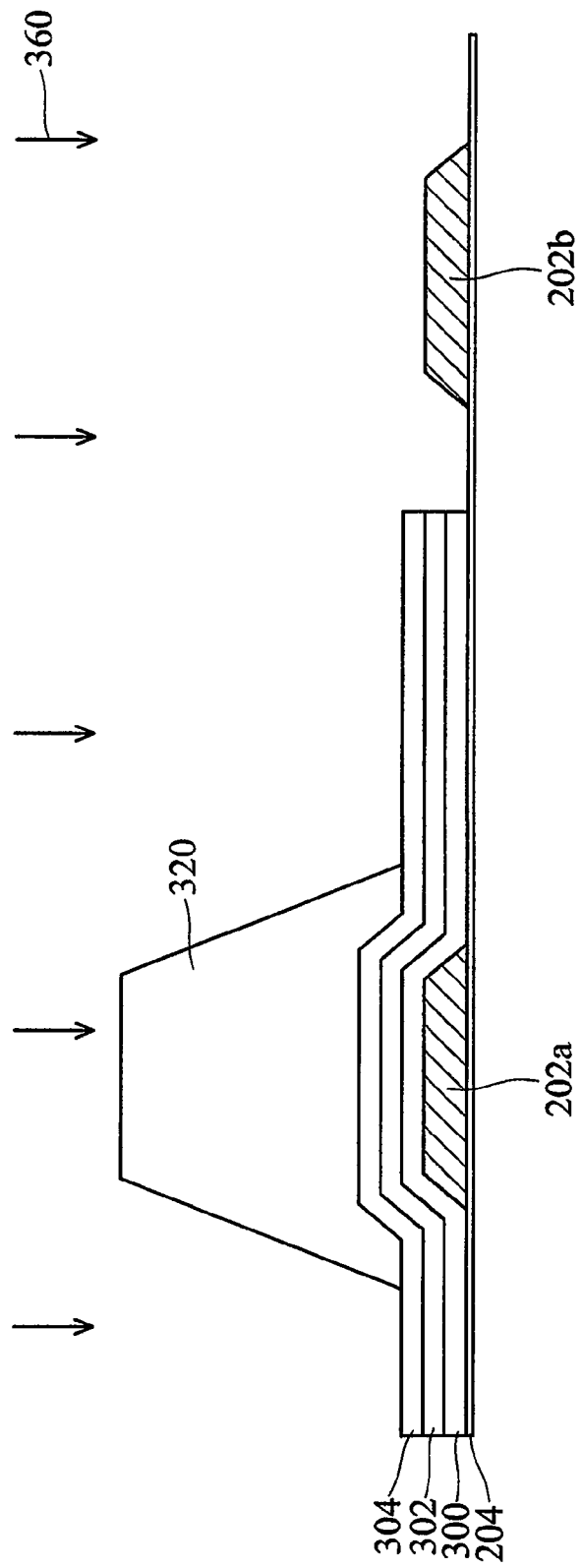

In FIG. 3F, another etching process 360 is then performed to etch the patterned resist layer 320 illustrated in FIG. 3E, using etching gas such as $O_2$, $SF_6/O_2$, or other suitable gases, to expose portions of the ohmic contact layer 304 adjacent to the gate electrode 202a. Herein, the patterned resist layer 320 still remains over an area over the gate electrode 202a.

Figure 3G:
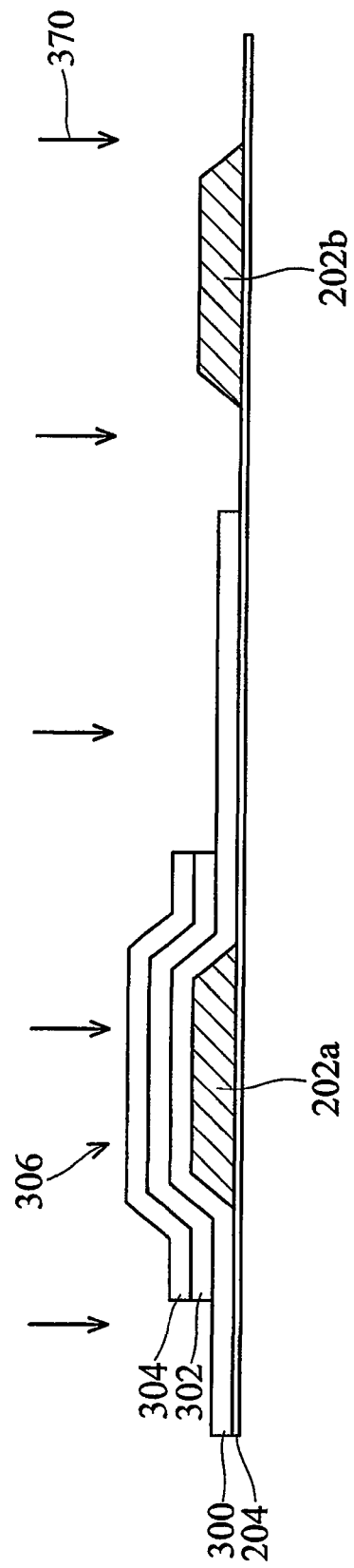

In FIG. 3G, another etching process 370 is then performed to etch the ohmic contact layer 304 and the semiconductor layer 302 exposed by the patterned resist layer 320 illustrated in FIG. 3F, using etching gas such as $Cl_2$, $SF_6/Cl_2$, or other suitable gases, and stops on the insulating layer 300. Thus, the stacked structure 360 and the pad 202b illustrated in FIG. 3B is formed.

Figure 4A:
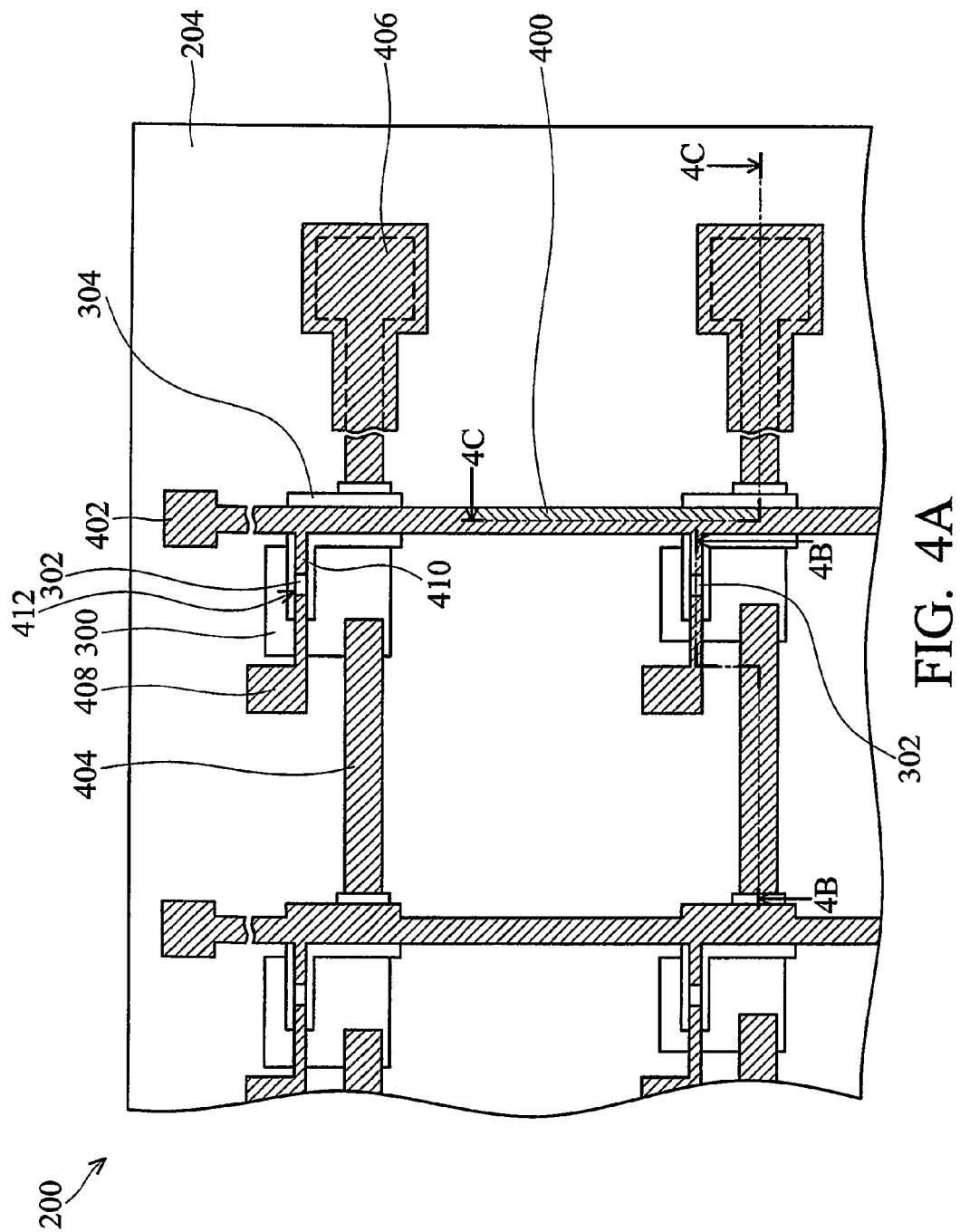

FIG. 4A illustrates a top view of the array substrate 200 of FIG. 3A with patterned metal layers 400, 402, 404, 406, 408, 410, and openings 412 formed thereon. The above patterned metal layers are simultaneously formed by a third photolithography, wherein the patterned metal layer 400 and 402 are formed along a column direction and substantially cover the data conductive segments 206a (not shown), the ohmic contact layer 304 between the data conductive segment 206b and the pad 206b, and connect the underlying data conductive segments 206a to thereby form a data line. The data line with such structure has a lower resistance than that of the conventional data line with a continuous structure and signal loss thereon is thus reduced and therefore suitable for a large size display device. The patterned metal layer 404 and 406 along the column direction respectively covers parts of the gate line 202a and adjacent insulating layer 300 and pad 202b. The patterned metal layer 408 covers portions of the substrate 204, insulating layer 300 and ohmic contact layer 304 and the patterned metal layer 410 covers the ohmic contact layer 304 and is connected to the metal layer 400. In the third photolithography, the ohmic contact layer 304, portions of the semiconductor layer 302 relative to a middle of the gate electrode 202a are also etched to thereby expose an opening 412 in which exposing the semiconductor layer 302.

Herein, the patterned metal layers 400, 402, 404, 406 overlap and directly connects the previously formed gate lines 202, data conductive segments 206a and pads 202a, 202b to thereby increase the thickness of portions of the data line 202 and the data conductive line 206a. The thicknesses of these lines are about 2000-4000 Å and may comprise material such as Al, Mo, Cr or other metals.

Referring to FIGS. 4B and 4C, cross sections taken along lines 4B-4B and 4C-4C in FIG. 4A are respectively shown, wherein FIG. 4B illustrates formation of an opening 412 and the patterned metal layers 408, 410 separated thereon during the third photolithography. The opening 412 exposes the semiconductor layer 302 therein and thereby defines source/drain regions of a thin film transistor. Herein, the stacked structure 306 can thus function as a thin film transistor and the patterned metal layer 408 and 410 directly formed over the ohmic contact layer 302 thereby function as source/drain electrodes, wherein the patterned metal layer 408 further extends to portions of the substrate 204 and the patterned metal layer 410 extends to the second recess 210 to thereby electrically connect the adjacent metal layer 400 (not shown).

As shown in FIGS. 4B and 4C, the patterned metal layer 400, 404, and 406 increase an overall thickness of the data conductive segments 206a, gate line 200 and pad 202b and are disconnected at the intercrosses thereof to thereby separate and prevent shorting thereto.

Figure 5A:
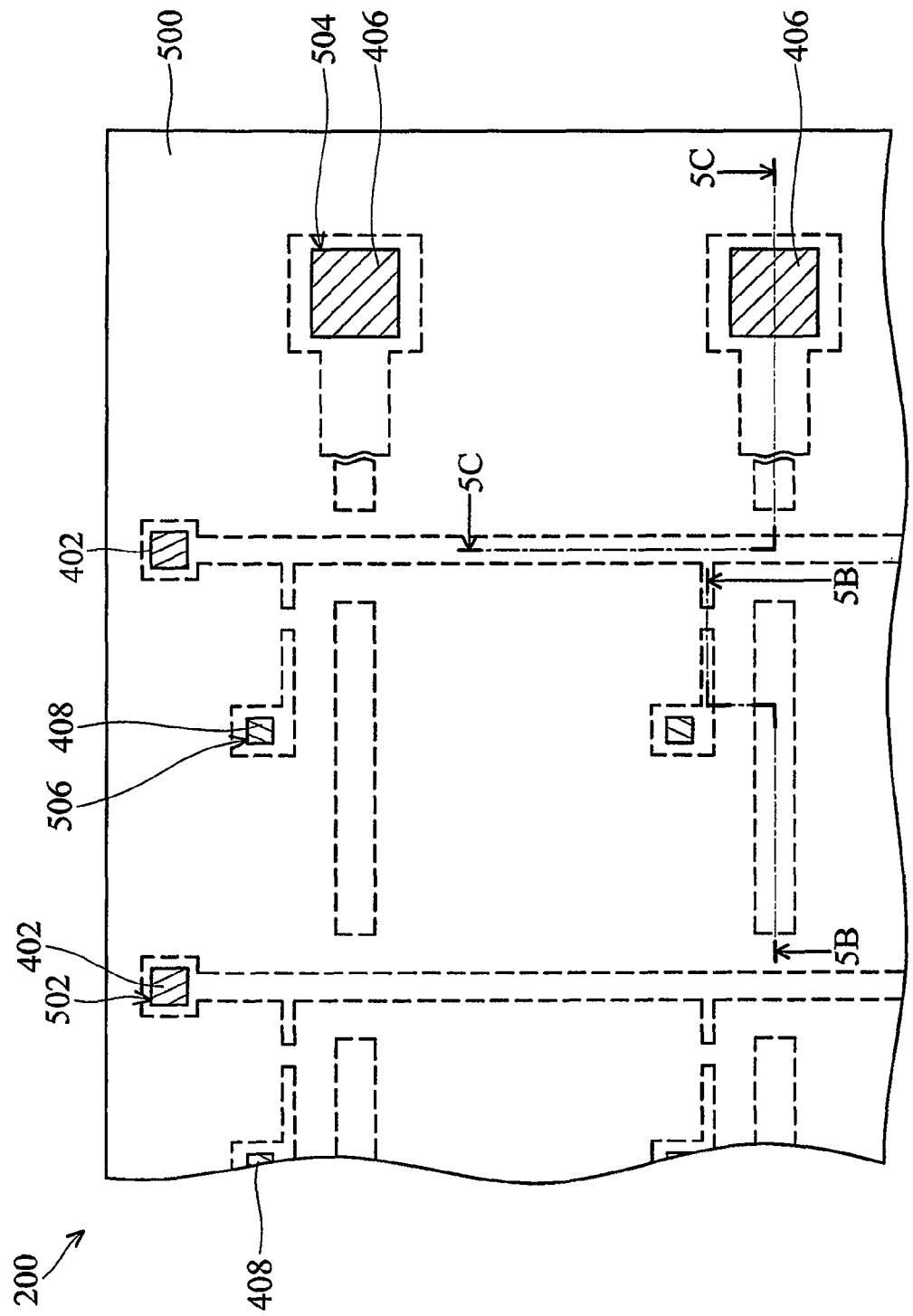

FIG. 5A illustrates a top view of the TFT substrate 200 illustrated in FIG. 4A formed with a patterned passivation layer 500 thereon by a fourth photolithography, wherein via holes 502, 504, and 506 are also formed in the passivation layer 500 to thereby expose portions of the metal layers 402, 406 and 408. The passivation layer 500 is formed at a thickness of about 1000-50000 Å and materials thereof can be, for example, silicon nitride, silicon oxide, silicon oxynitride, organic materials or other suitable materials.

Referring to FIGS. 5B and 5C, cross sections taken along the 5B-5B 5C-5C lines of FIG. 5A are respectively illustrated. The passivation layer 500 is first blanketly formed over the substrate 204 and covers the previously formed structure thereon and is then patterned by a fourth photolithography to define via holes 502 and 504. The via holes 502 and 504 respectively expose portions of the metal layers 408 and 406.

Figure 6A:
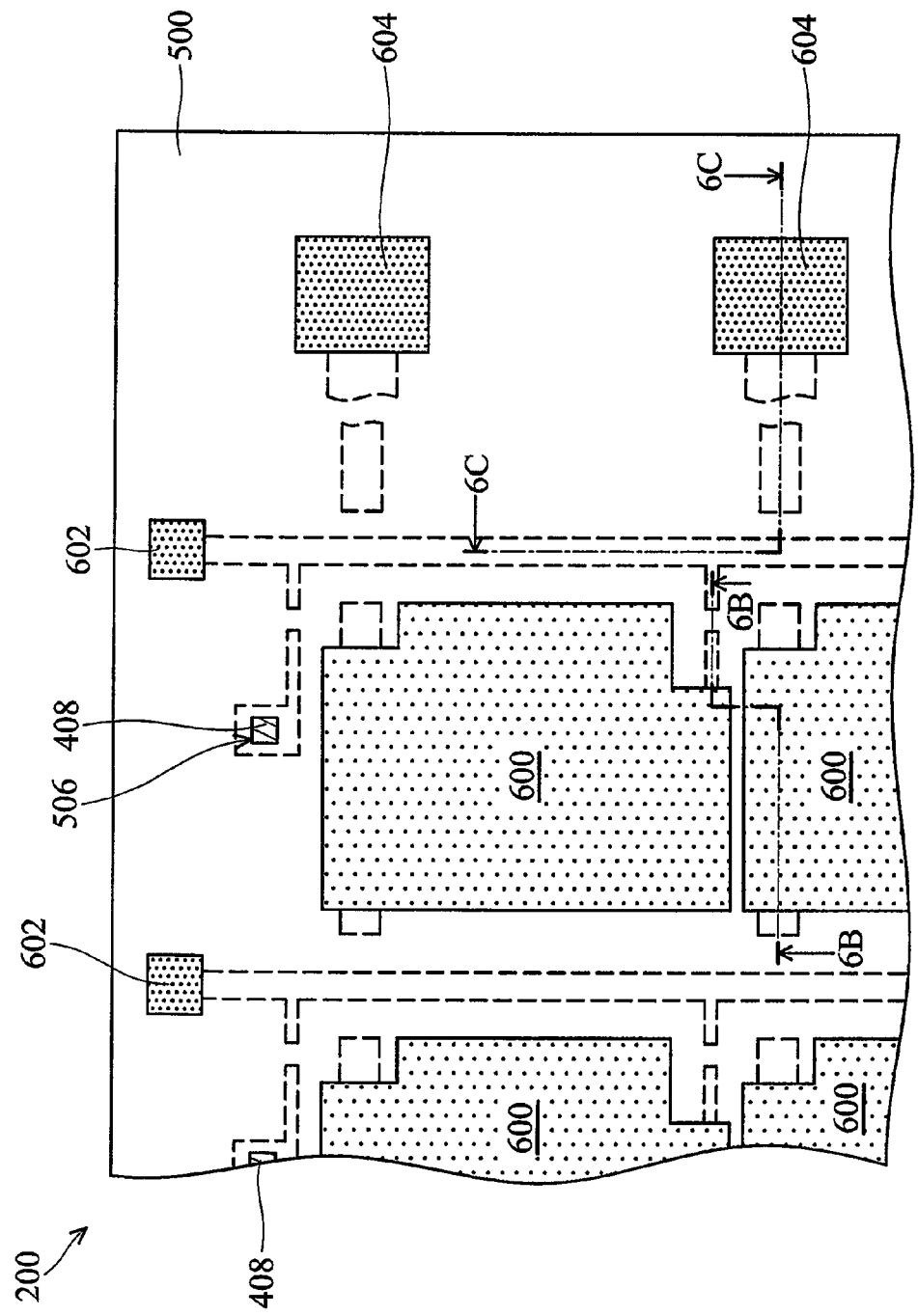

Next, FIG. 6A illustrates a top view of the TFT substrate 200 illustrated in FIG. 5A with a patterned transparent conductive layer 600, 604, and 602 formed thereon by a fifth photolithography, wherein the patterned transparent conductive layer 600 is formed over a display region defined by the above data lines and gate lines and connects the underlying metal layer 408 through the via holes 506 to thereby conduct currents from the metal layer 408 thereto. The patterned transparent conductive layers 602 and 604 electrically and respectively connects the underlying metal layer 402 and 406 through via holes 502 and 504. The patterned transparent conductive layers 600, 602 and 604 are formed with a thickness of about 400-2000 Å and materials thereof can be, for example, indium tin oxide (ITO) or indium zinc oxide (IZO). Herein, the portion of the transparent conductive layer 600 overlapping the passivation layer 500 functions as a pixel electrode and the portion of the transparent conductive layer 600 overlapping the gate line 204 may function as a component of a storage capacitor. FIGS. 6B and 6C illustrate cross sections taken along the 6B-6B 6C-6C lines of FIG. 5A, respectively, wherein the transparent conductive layer 600 and 604 electrically connect the underlying metal layers 408 and 406 through the via holes 502, 504, respectively.

Figure 7A:
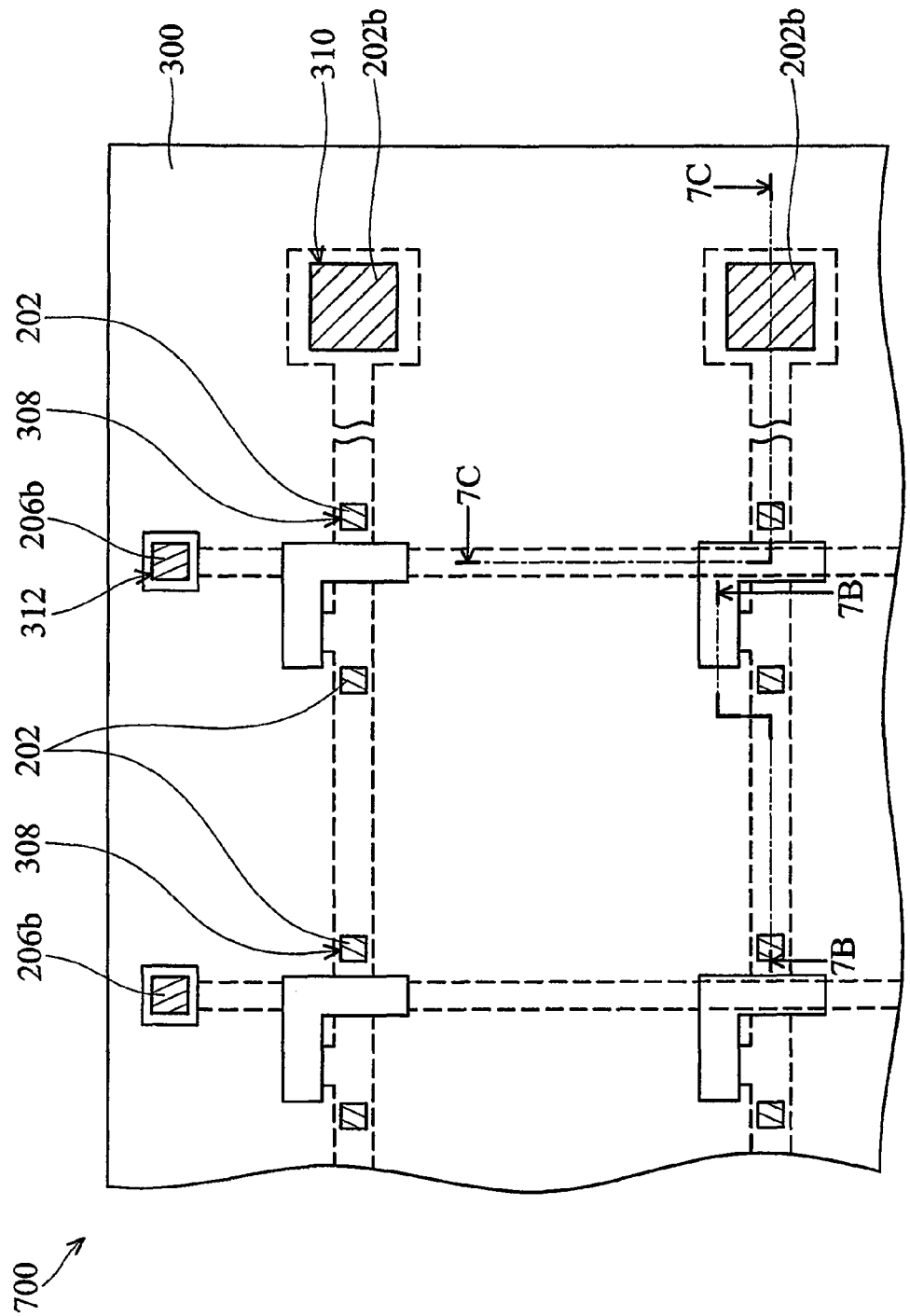
FIGS. 7A and 8A are schematic top views showing fabrication steps of an array substrate according to another embodiment of the invention.
Figure 7B:
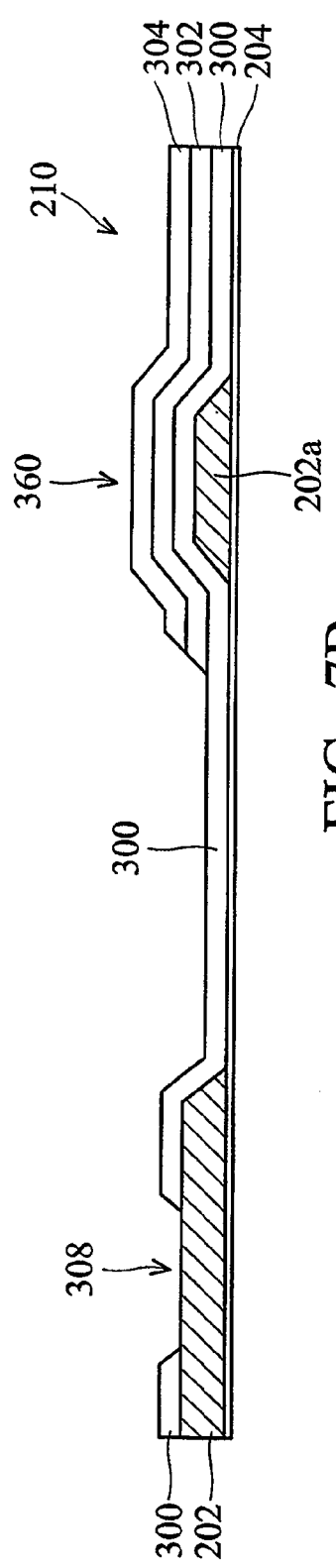
FIGS. 7B and 8B are schematic cross sections showing fabrication steps of an array substrate according to an embodiment of the invention.
Figure 7C:
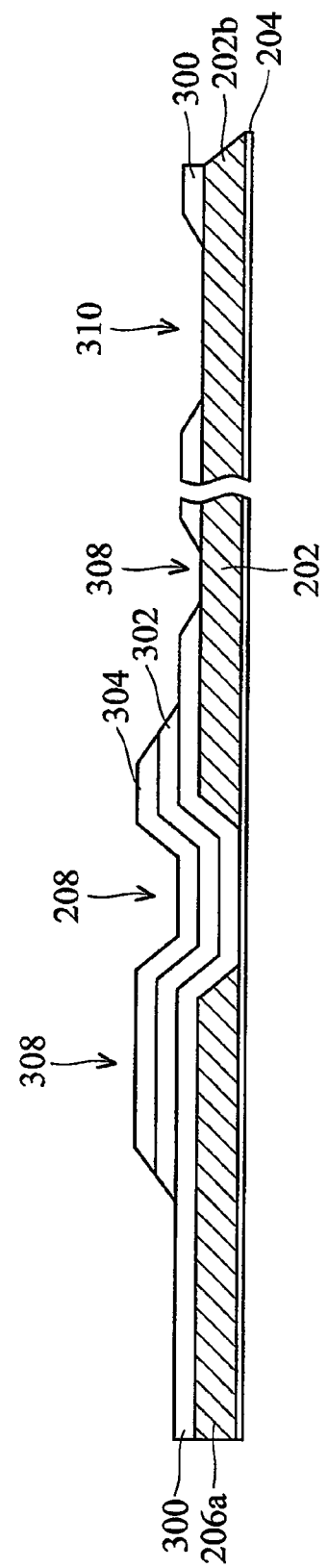
FIGS. 7C and 8C are schematic cross sections showing fabrication steps of an array substrate according to an embodiment of the invention.
Figure 7D:
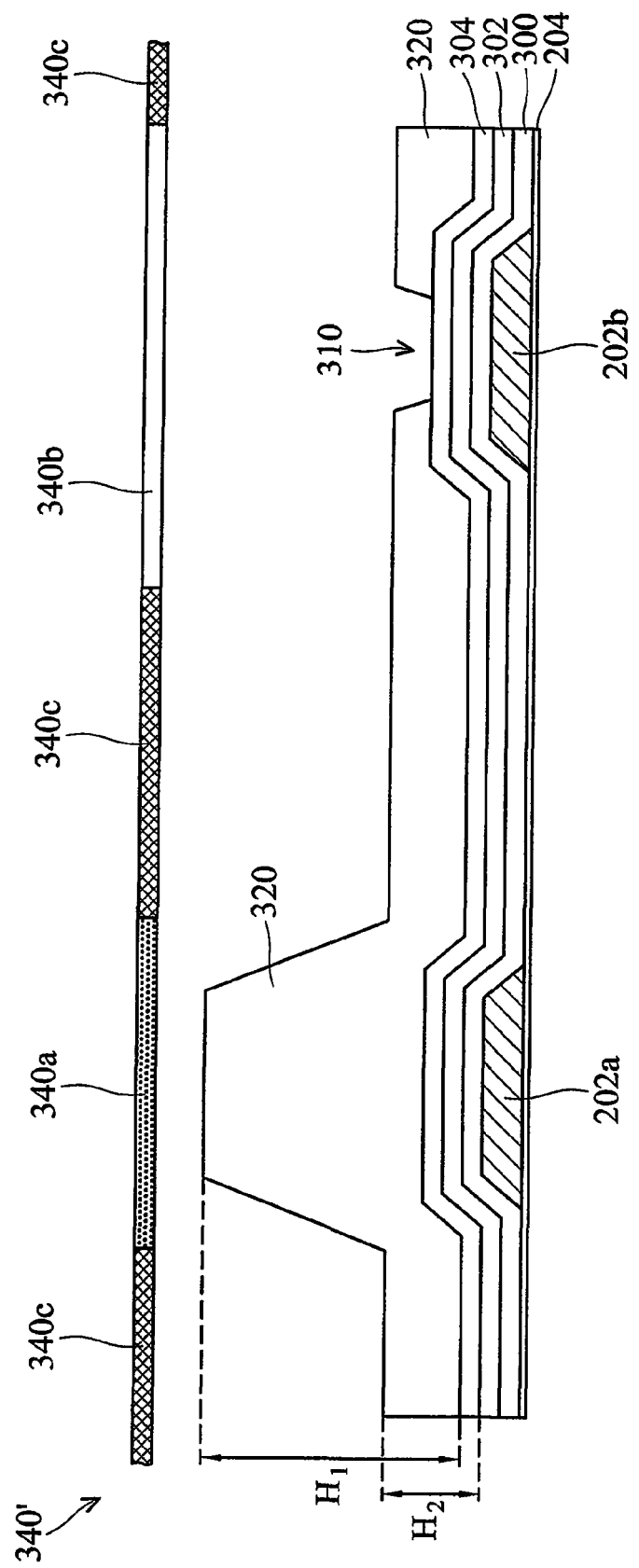
FIGS. 7D-7G are schematic diagrams showing the second photolithography for using in the fabrication step illustrated by FIGS. 7A-7C.
Figure 7E:
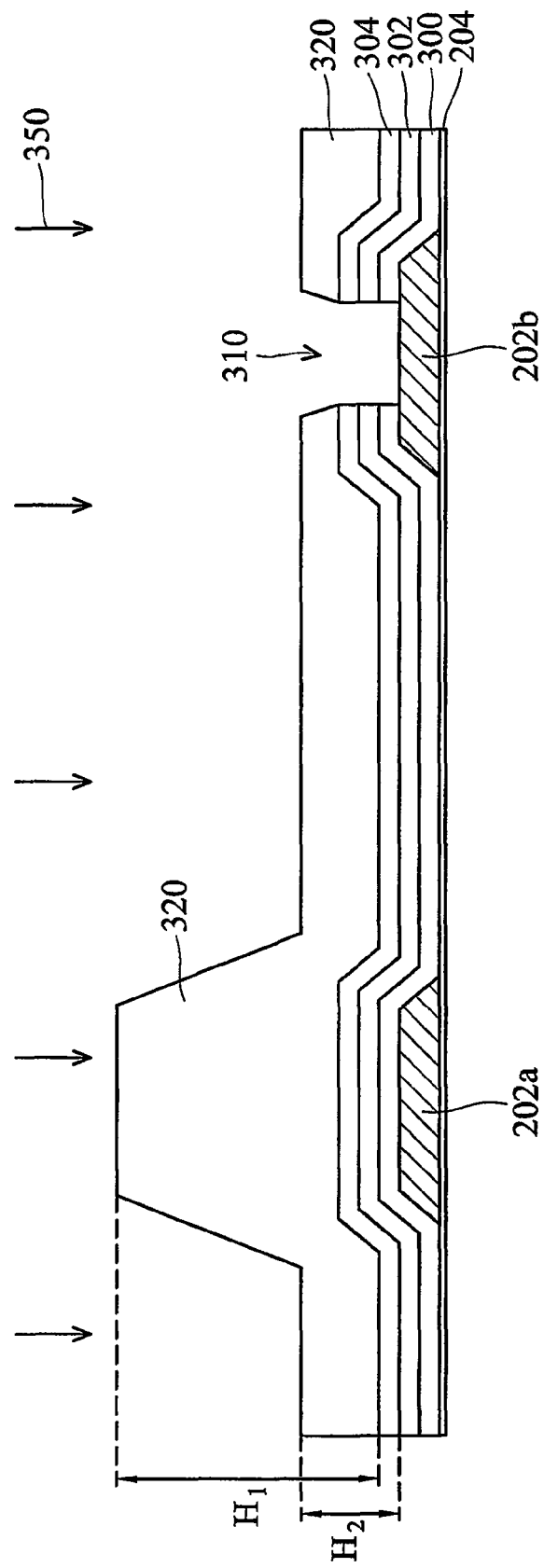
Figure 7F:
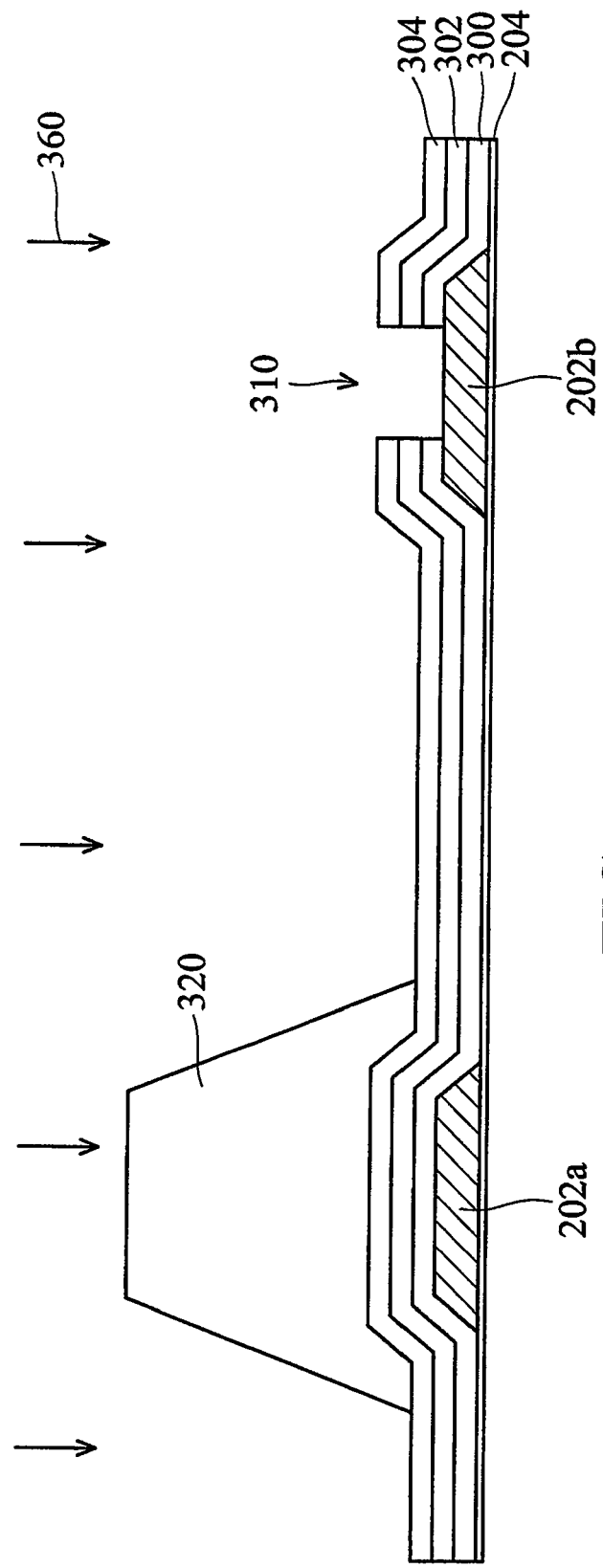
Figure 7G:
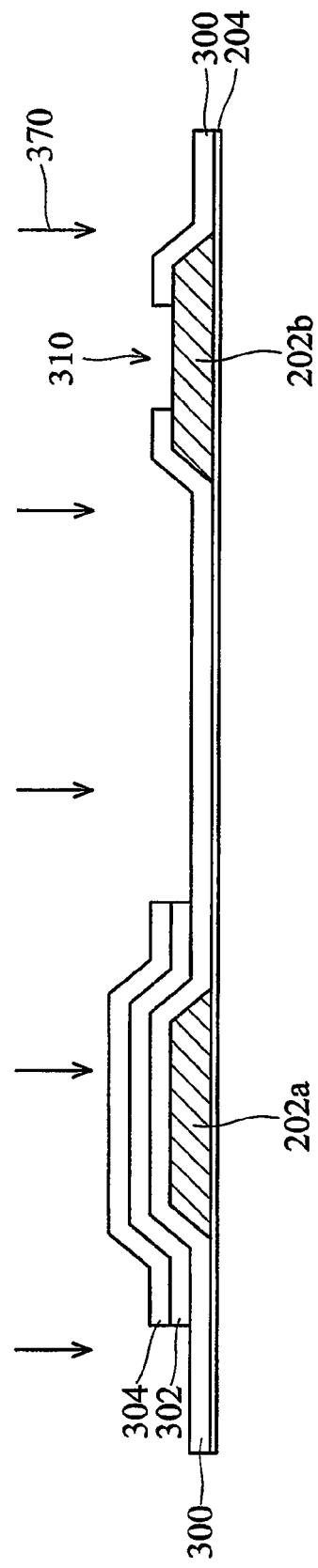
Figure 8A:
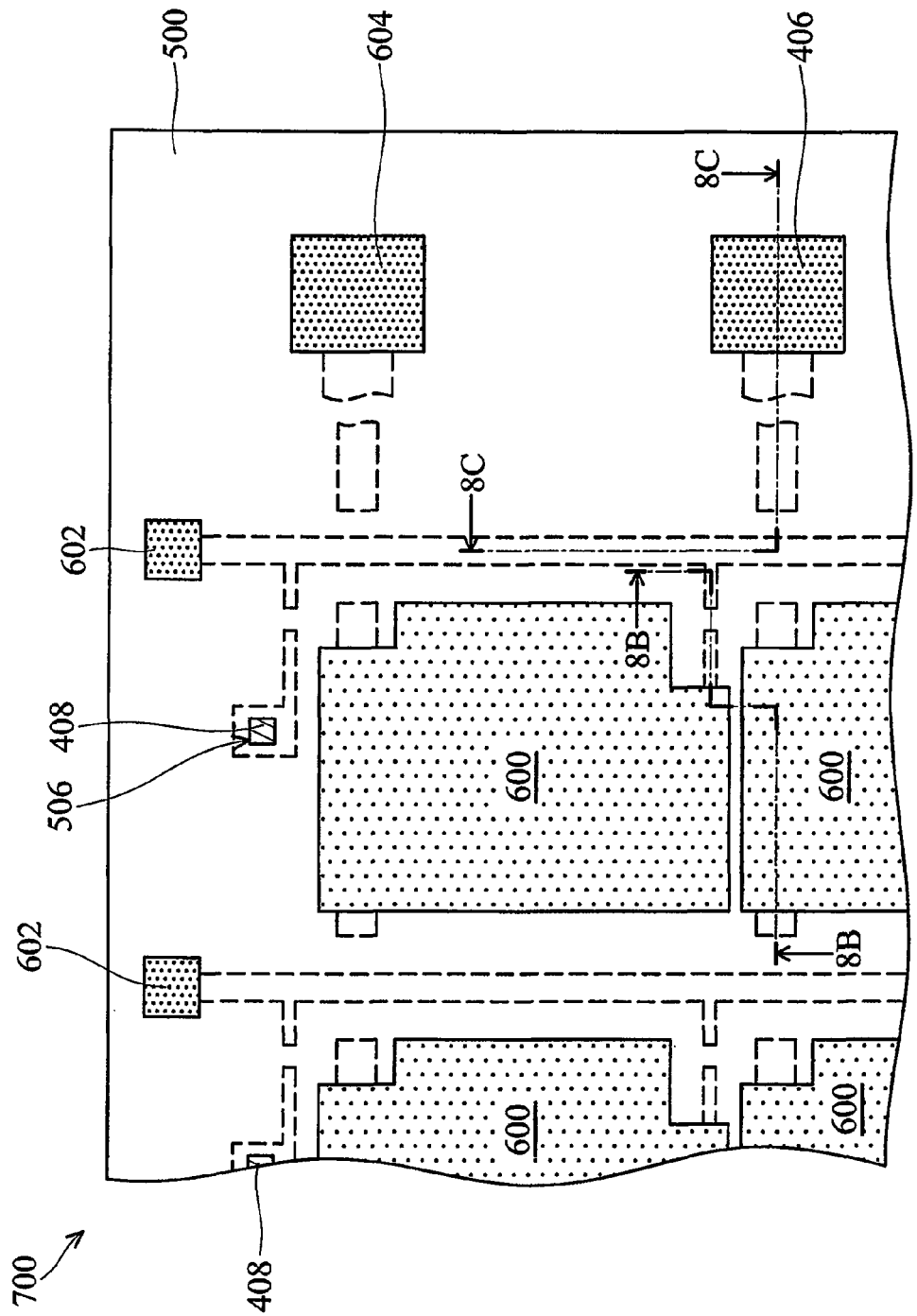
Figure 8B:
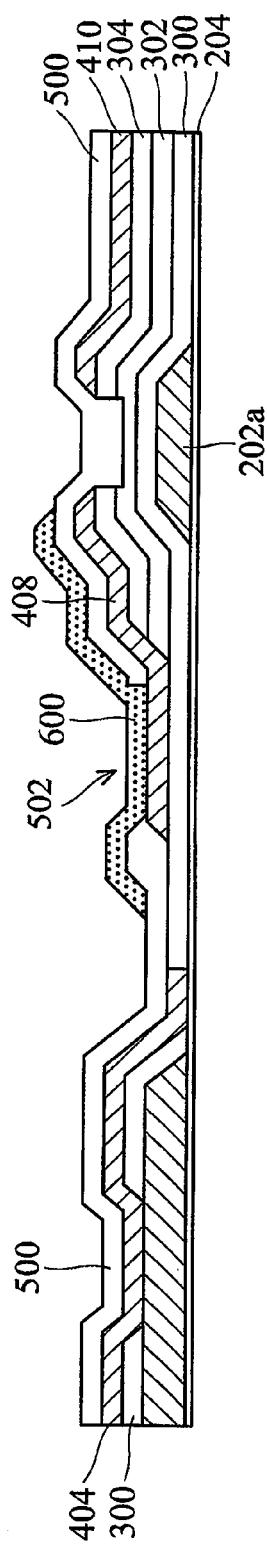
Figure 8C:
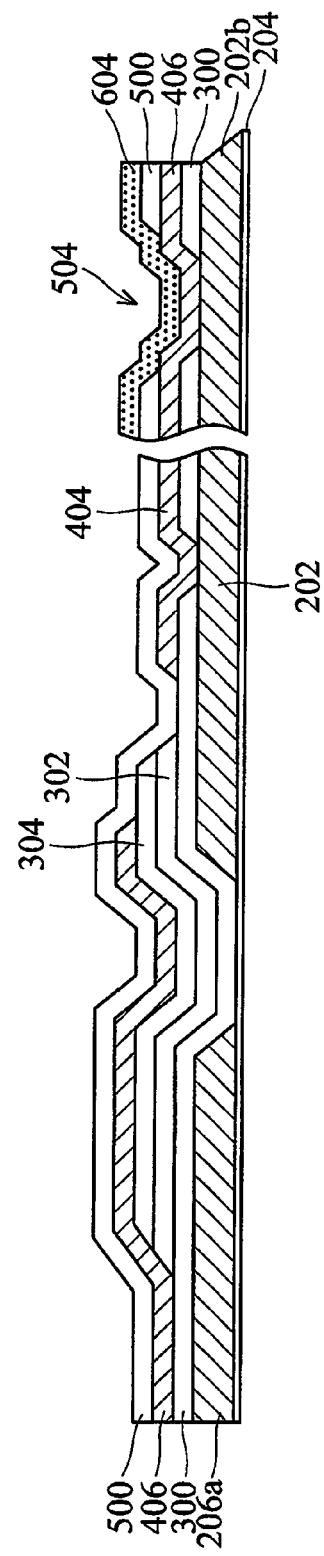

FIGS. 7-8 are schematic diagrams showing an array substrate process according to another exemplary embodiment using similar fabrication steps of the above exemplary embodiment and merely illustrate differences there between here. FIGS. 7A and 8A are top views during fabrication and FIGS. 7B-7C and 8B-8C are cross sections taken along lines B-B and C-C of FIGS. 7A and 8A.

FIG. 7A illustrates a top view of an array substrate 700 with a patterned insulating layer 300, semiconductor layer 302 and ohmic contact layer 304 formed thereon. Before formation of the above layers, the array substrate 700 is formed with a similar structure as that of the array substrate 200 provided in FIG. 2A and the above patterned layers are simultaneously formed by a second photolithography. Compared to FIG. 3A, the insulating layer 300 is blanketly formed over the entire substrate 204(not shown) and fills in the first recesses 208 (shown in FIG. 7B) and the second recesses 210 (shown in FIG. 7C). The ohmic contact layer 304 is formed over the insulating layer 300 with reversed L shape and substantially overlaps the gate electrodes 202a and adjacent data conductive segments 206a. Openings 308, 310, and 312 are formed in the insulating layer 300 to respectively expose portions of the gate lines 202 and pads 202b and 206b.

FIGS. 7B and 7C are schematic diagrams respectively showing a cross section taken along lines 7B-7B and 7C-7C in FIG. 7A, wherein materials for forming the patterned insulating layer 300, semiconductor layer 302 and ohmic contact layer 304 are first blanketly formed and stacked over the substrate 204 in sequence and then patterned by a second photolithography, using a mask having a plurality of areas of various transmittances, thereby forming a resist layer of different thicknesses over the ohmic contact layer 304. During the second photolithography, three sequential etching steps are performed to thereby form stacked structures 306 and 308 respectively over the gate electrode 202a and the first recess 208 and adjacent insulating layer 204 thereof. The above insulating layer 300, semiconductor layer 302 and ohmic layer 304 are formed of, for example, silicon nitride or silicon oxynitride, α-Si:H and N$^+$α-Si:H, at thicknesses of 2000-5000 Å, 1000-3000 Å, and 100-1000 Å, respectively.

Herein, the above second photolithography is further illustrated by the following FIGS. 7D-7G, showing fabrication in an area adjacent to the gate electrode 202a and the pad 202b as an example. Fabrication in other areas is not shown here but can be understood and modified by those skilled in the art within the field of the invention. Referring to FIG. 7D, a substrate 204 formed with a gate electrode 202a and a pad 202b thereon is first provided. Next, an insulating layer 300, semiconductor layer 302, and ohmic contact layer 304 are then sequentially formed over the substrate 204 and cover the gate electrode 202a and the pad 202b thereon. Next, a resist layer 320 is coated onto the substrate 204 and exposed during the second photolithography by a conventional photolithography apparatus using a mask 340' illustrated in FIG. 7D. Herein, the mask 340' includes an opaque area 340a, a transparent area 340b, and a plurality of partially light-transmittive areas 340c, wherein the opaque area 340a has a transmittance of about 0% and substantially locates at a position relative to the gate electrode 202a, the transparent area 340b has a transmittance of about 100% and locates at a place relative to the pad 202b, and the partially light-transmittive areas 340c has a transmittance of about 20-80% and locates substantially over other areas. During the second photolithography, a single exposure is performed and a structure is formed after a resist development, as shown in FIG. 7D. The resist layer 320 is patterned to leaves areas of various thicknesses over the areas relative to the gate electrode 202a and the adjacent ohmic contact layer 204 thereof. An opening 310 is formed in the resist layer 320 at a position relative to the pad 202b and exposes an omhic contact layer 304 therein. Due to different transmittance within various areas of the mask 340', the resist layer 320 relative to the transparent area 340b is fully exposed and removed by the resist development. The resist layer 320 relative to the opaque area 340a is not exposed and the partially light-transmittive areas 340c are partially exposed to thereby leave the patterned resist layer 320 with different thicknesses after the resist development. The patterned resist layer 320 relative to the opaque area 340a is formed at a thickness $H_1$ of about 15000-30000 Å and the resist layer relative to the partially light-transmittive area 340c is formed at a thickness $H_2$ of about 3000-20000 Å.

In FIG. 7E, etching process 350 is then performed to remove the ohmic contact layer 304, the semiconductor layer, and the insulating layer 300 exposed by opening 310, using etching gas such as $SF_6$, $CF_4$, or other suitable gases and stops on the pad 202b.

In FIG. 7F, another etching process 360 is then performed to etch the patterned resist layer 320 illustrated in FIG. 7E, using etching gas such as $O_2$, $SF_6/O_2$, or other suitable gases, to expose portions of the ohmic contact layer 304. Herein, the patterned resist layer 320 merely remains over an area over the gate electrode 202a and covers a portion of adjacent ohmic contact layer 304 thereof.

In FIG. 7G, another etching process 370 is then performed to etch the ohmic contact layer 304 and the semiconductor layer 302 exposed by the patterned resist layer 320 illustrated in FIG. 7F, using etching gas such as $Cl_2$, $SF_6/Cl_2$, or other suitable gases, and stops on the insulating layer 300. Therefore, the stacked structure 360 and the pad 202b as illustrated in FIG. 7B are thereby formed.

Compared to the conventional fabrication illustrated in FIGS. 1A-1F, two steps of photolithography are needed for fabricating the pad 202b and the stacked structure 306 as shown in FIG. 7G. However, the pad 202b and the stacked structure 306 can be formed by the second photolithography used in the above exemplary embodiments and one step of photolithography is eliminated. Thus, production cost and time consumed is reduced.

Next, following fabrication such as the fabrication steps illustrated in FIGS. 4-6 are continuously performed to form the TFT array display 700 with patterned transparent conductive layers 600, 602 and 604 shown in FIG. 8A. FIGS. 8B and 8C are schematic diagrams respectively showing a cross section taken along lines 8B-8B and 8C-8C in FIG. 8A, illustrating similar structures as that illustrated in FIGS. 6B and 6C, respectively.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating an array substrate, comprising:
forming a first metal layer over a substrate;
patterning the first metal layer by a first photolithography, forming a gate line, a gate electrode connected to the gate line, and a pad over the substrate;
forming an insulating layer, a semiconductor layer, and an ohmic contact layer over the substrate, covering the gate line, the gate electrode and the pad; and
patterning the ohmic contact layer, the semiconductor layer, and portions of the insulating layer by a second photolithography, forming a semiconductor structure over the substrate and a via hole in the insulating layer over the pad to exposing a part of the pad, wherein the semiconductor structure comprises a patterned insulating layer substantially covering the gate electrode, a patterned semiconductor layer and a patterned ohmic contact layer, and a top surface of the substrate not covered by the gate line, the gate electrode, and the pad is covered by the patterned insulating layer, and
wherein the second photolithography comprises:
forming a resist layer over the ohmic layer;
patterning the resist layer by a photolithography using a mask having an opaque area, a transparent area, and a partially light-transmittive area, to form an opening in the resist layer substantially relative to the partially light-transmittive area, a first portion with a first thickness in the resist layer substantially relative to the opaque area, and a second portion with a second thickness in the resist layer substantially relative to the partially transparent area, wherein the first thickness is greater than the second thickness, the transparent area substantially aligns to the pad, the opaque area substantially aligns to the gate electrode, and the partially light-transmittive area substantially aligns to an area other than the pad and the gate electrode;
performing a first etching, using the first resist portion and the second portion of the resist layer as etching masks, to remove the ohmic contact layer exposed by the opening, the semiconductor layer and the insulating layer underlying the semiconductor layer and stopping on the pad;
performing a second etching to the first and second portions of the resist layers, leaving the first portion of the resist layer with a reduced thickness substantially over the gate electrode and portions of the ohmic contact layer not exposed by the first portion of the resist layer with a reduced thickness;
performing a third etching to etch the ohmic contact layer exposed by the first portion of the resist layer and the semiconductor layer thereunder; and
removing the first portion of the resist layer with a reduced thickness to leave a semiconductor structure and a pad exposed by the opening, wherein the semiconductor structure comprises the insulating substantially covering the gate electrode, the patterned semiconductor layer, and the patterned ohmic contact layer.

2. The method as claimed in claim 1, further comprising:
forming a second metal layer over the substrate, covering the semiconductor structure and filling the via hole to thereby electrically connect the pad; and
patterning the second metal layer, the ohmic contact layer and the semiconductor layer at a middle portion of the semiconductor structure by a third photolithography to define a pair of source/drain regions and a patterned second metal layer overlying the source/drain regions and the pad.

3. The method as claimed in claim 1, wherein the first thickness is about 15000-30000Å and the second thickness is about 3000-20000Å.

4. The method as claimed in claim 1, wherein the insulating layer comprises silicon nitride or silicon oxynitride ($SiO_xN_y$).

5. The method as claimed in claim 1, wherein the semiconductor layer comprises α-si:H material.

6. The method as claimed in claim 1, wherein the ohmic contact layer comprises $n^+$α-si:H material.

7. The method as claimed in claim 1, wherein the first etching is dry etching using etching gas comprising $SF_6$ or $CF_4$.

8. The method as claimed in claim 1, wherein the second etching is dry etching using etching gas comprising $SF_6$ and $O_2$, or $O_2$ only.

9. The method as claimed in claim 1, wherein the third etching is dry etching using etching gas comprising $Cl_2$, $SF_6$ and $Cl_2$, $BCl_3$, and $BCl_3$ and $CF_4$.

10. The method as claimed in claim 1, wherein the partially light-transmittive area has a transmittance of about 20-80%.

11. The method as claimed in claim 1, wherein the opaque area has a transmittance of about 0% and the transparent area a transmittance of about 100%.

* * * * *